United States Patent [19]
Rhines et al.

[11] Patent Number: 5,392,299
[45] Date of Patent: Feb. 21, 1995

[54] TRIPLE ORTHOGONALLY INTERLEAED ERROR CORRECTION SYSTEM

[75] Inventors: Don S. Rhines, Richardson; William D. McCoy, Wylie, both of Tex.; Kirk H. Handley, Redwood City, Calif.

[73] Assignees: E-Systems, Inc., Dallas, Tex.; Ampex Corporation, Redwood City, Calif.

[21] Appl. No.: 820,737

[22] Filed: Jan. 15, 1992

[51] Int. Cl.$^6$ .............................................. G06F 11/10
[52] U.S. Cl. .................................. 371/37.5; 371/37.4
[58] Field of Search ...................... 371/37.4, 37.5, 37.7

[56] References Cited

U.S. PATENT DOCUMENTS

| | | | |
|---|---|---|---|
| Re. 30,187 | 1/1980 | Hong et al. | 371/37.4 |
| Re. 31,311 | 7/1983 | Miller | 360/40 |
| 3,786,439 | 1/1974 | McDonald et al. | 371/37.4 |
| 3,868,632 | 2/1975 | Hong et al. | 371/37.4 |
| 4,413,340 | 11/1983 | Odaka et al. | 371/38.1 |
| 4,541,091 | 9/1985 | Nishida et al. | 371/37.5 |
| 4,567,594 | 1/1986 | Deodhar | 371/38.1 |
| 4,598,403 | 7/1986 | Odaka | 371/39.1 |
| 4,637,021 | 1/1987 | Shenton | 371/37.5 |
| 4,677,622 | 6/1987 | Okamoto et al. | 371/37.5 |
| 4,680,764 | 6/1987 | Suzuki et al. | 371/37.5 |
| 4,730,321 | 3/1988 | Machado | 371/38.1 |
| 4,742,517 | 5/1988 | Takagi et al. | 371/37.4 |
| 4,802,170 | 1/1989 | Trottier | 371/40.1 |
| 4,852,099 | 7/1989 | Ozaki | 371/37.5 |
| 4,852,102 | 7/1989 | Yamaguchi | 371/37.4 |

FOREIGN PATENT DOCUMENTS

| | | |
|---|---|---|
| 0273676A2 | 12/1987 | European Pat. Off. |
| 0341851A3 | 4/1989 | European Pat. Off. |
| 0551973 | 7/1993 | European Pat. Off. |
| 55-35562 | 3/1980 | Japan |

OTHER PUBLICATIONS

"Concentrated Coding Systems Employing a Unit-Memory Convolution Code and a Byte-Oriented Decoding Algorithm", Lin-Nan Lee, IEEE transactions on Communications, vol. COM-25, No. 10, Oct. 1977, pp. 1064-1074.

"Reliability and Throughput Analysis of a Concatenated Coding Scheme," R. H. Deng, IEEE Transactions on Communications, vol. COM-35, No. 7, Jul., 1987, pp. 698-705.

"The Design of High Performance Error-Correcting Coding Scheme for the Canadian Broadcast Telidon System Based on Reed-Solomon Codes," B. C. Mortimer, et al., IEEE Transactions on Communications, vol. COM-35, No. 11, Nov., 1987, pp. 1113-1122.

"Error Control Codes for Digital Recording Systems," S. W. Kim, IEEE Transactions on Consumer Electronics, Nov., 1989, pp. 907-916.

"Reed-Solomon Error and Eraser Corrections for PAM/FM Mobile Radio Systems," G. D. Aria, IEEE 38th Vehicular Technology Conference, 1988, pp. 485-488. (Month Unknown).

"A New Two-Inch Data Disc System with a High Transfer Rate," K. Kutaragi, et al., IEEE Transactions on Consumer Electronics, vol.-C-33, No. 4, Nov., 1987, pp. 540-550.

"Performance of Simple Cross-Interleaved Reed-Solomon Decoding Strategies for Compact Disc Players," C. C. Ko, et al.,—International Journal of Electronics, 1988, vol. 64, No. 4, pp. 627-635.

"Error Correction, Interleaving and Differential Pulse Position Modulation," R. E. Peile, International Journal of Satellite Communications, vol. 6, Jan. 1988, pp. 173-187.

Primary Examiner—Paul Gordon
Attorney, Agent, or Firm—Harold E. Meier

[57] ABSTRACT

The detection and correction of errors in digital data transmitted by or stored in a media channel is provided by processing the data through a triple orthogonally interleaved error correction system. On the transmit/store side of the system, the data is encoded three times prior to placement in the media channel with two different interleaving steps performed between the encoding steps. The first interleave is an orthogonal row shuffling interleave that provides enhanced protection against burst errors. On the receive/play back side, the data is decoded and deinterleaved, with included errors detected and corrected to enable recovery of the original data. To enhance the error correction, a circuit is used for generating a symbol accurate error flag identifying symbols containing errors thereby allowing the error correcting decoders to focus on and correct the data.

63 Claims, 14 Drawing Sheets

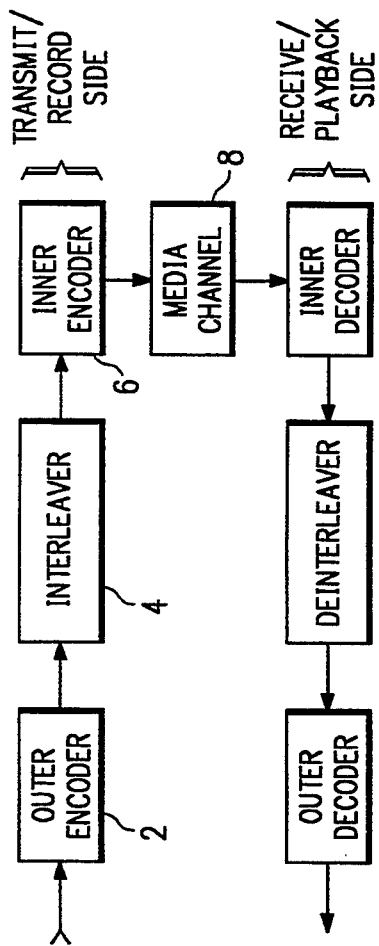
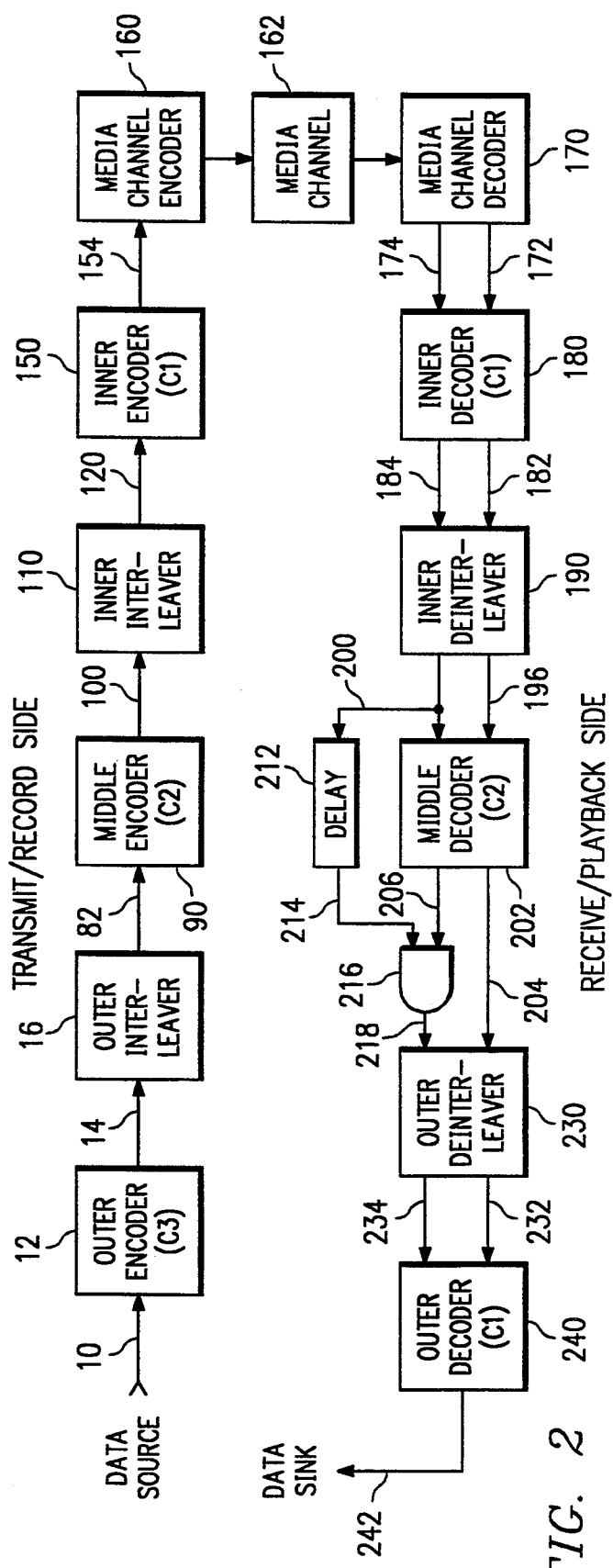
FIG. 1 (PRIOR ART)
FIG. 2

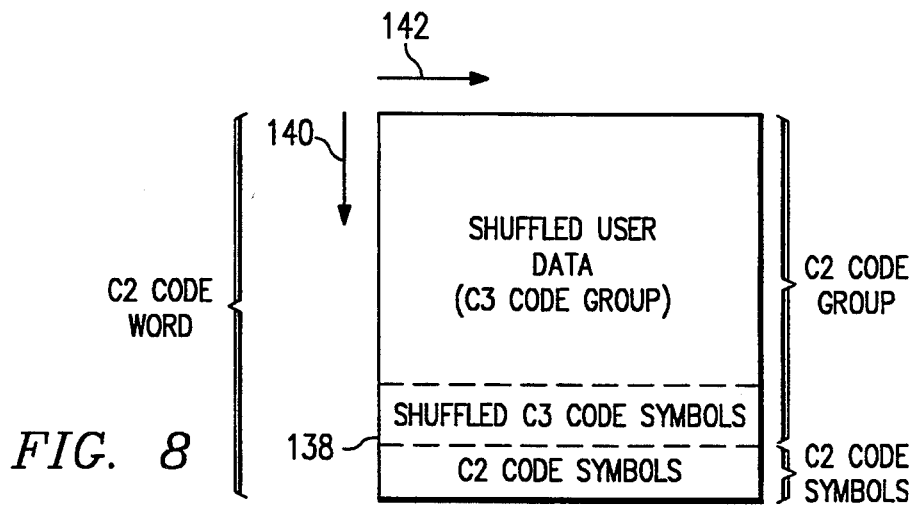
FIG. 8
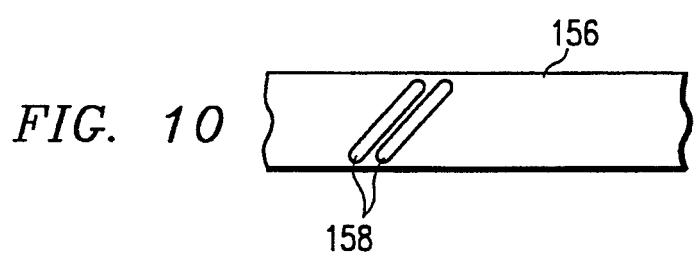
FIG. 10
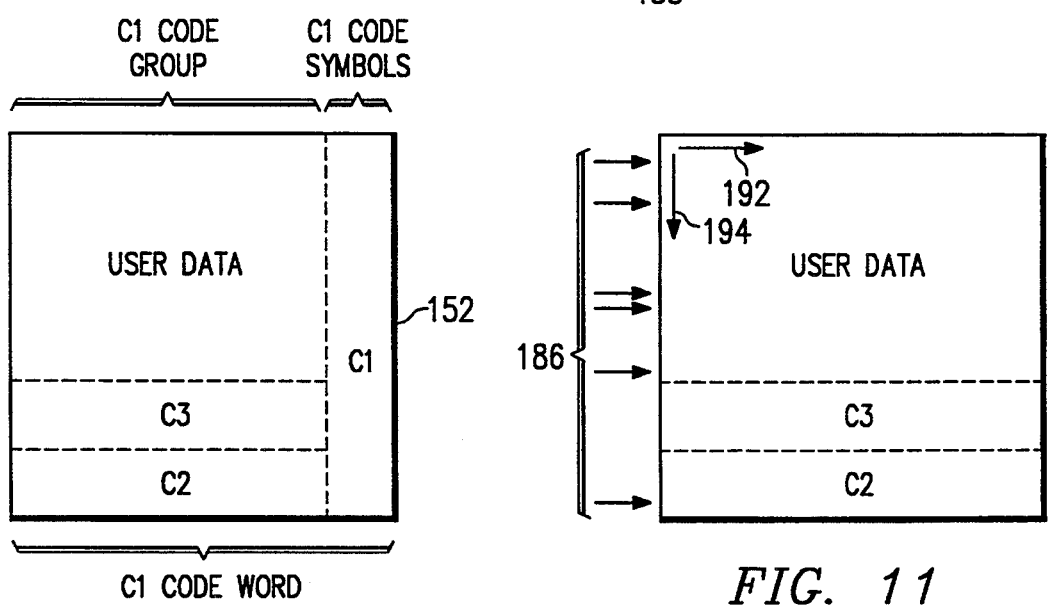
FIG. 9
FIG. 11
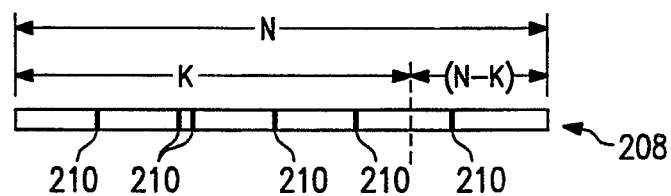
FIG. 12

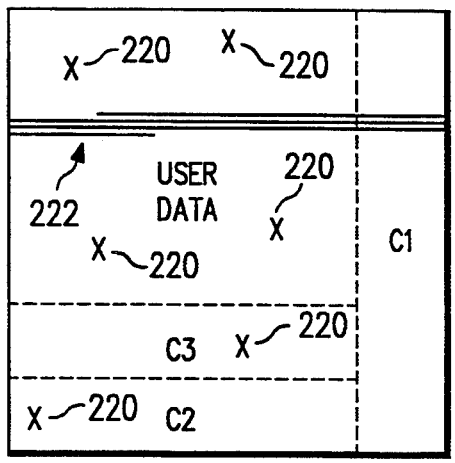
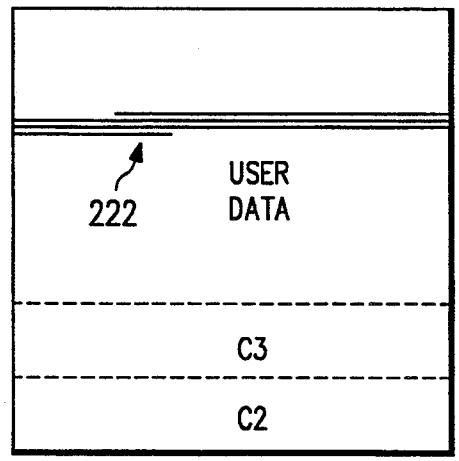
FIG. 13A        FIG. 13B
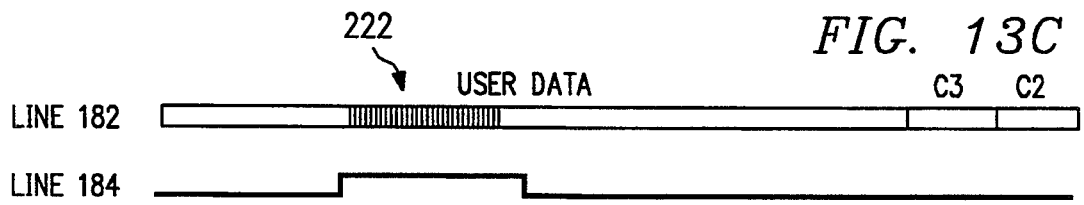
FIG. 13C
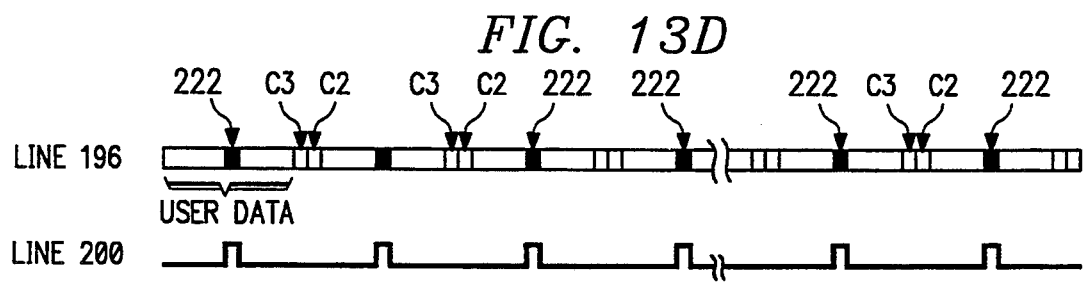
FIG. 13D
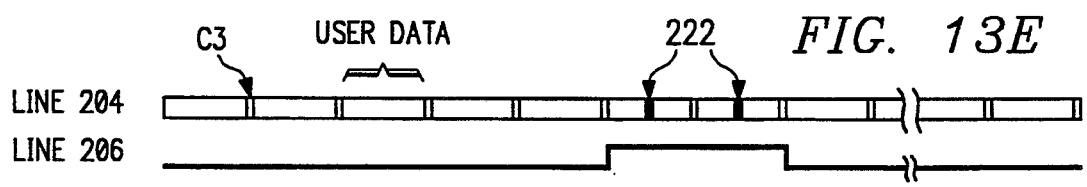
FIG. 13E
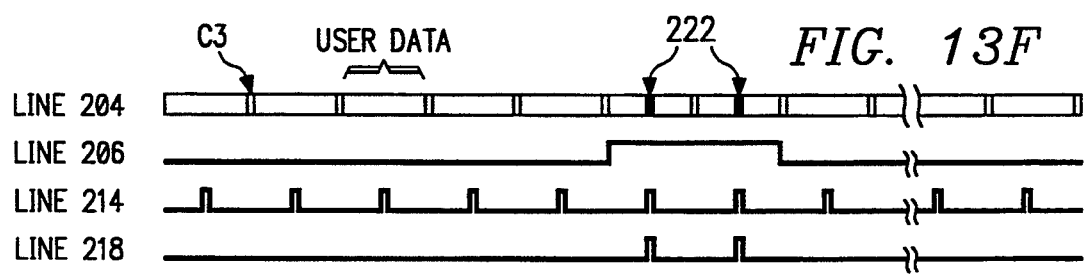
FIG. 13F

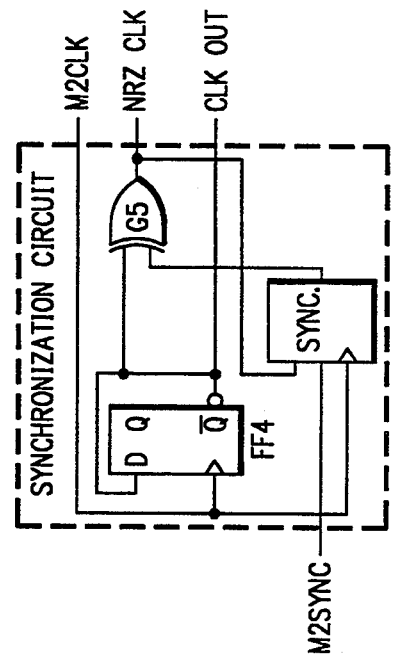
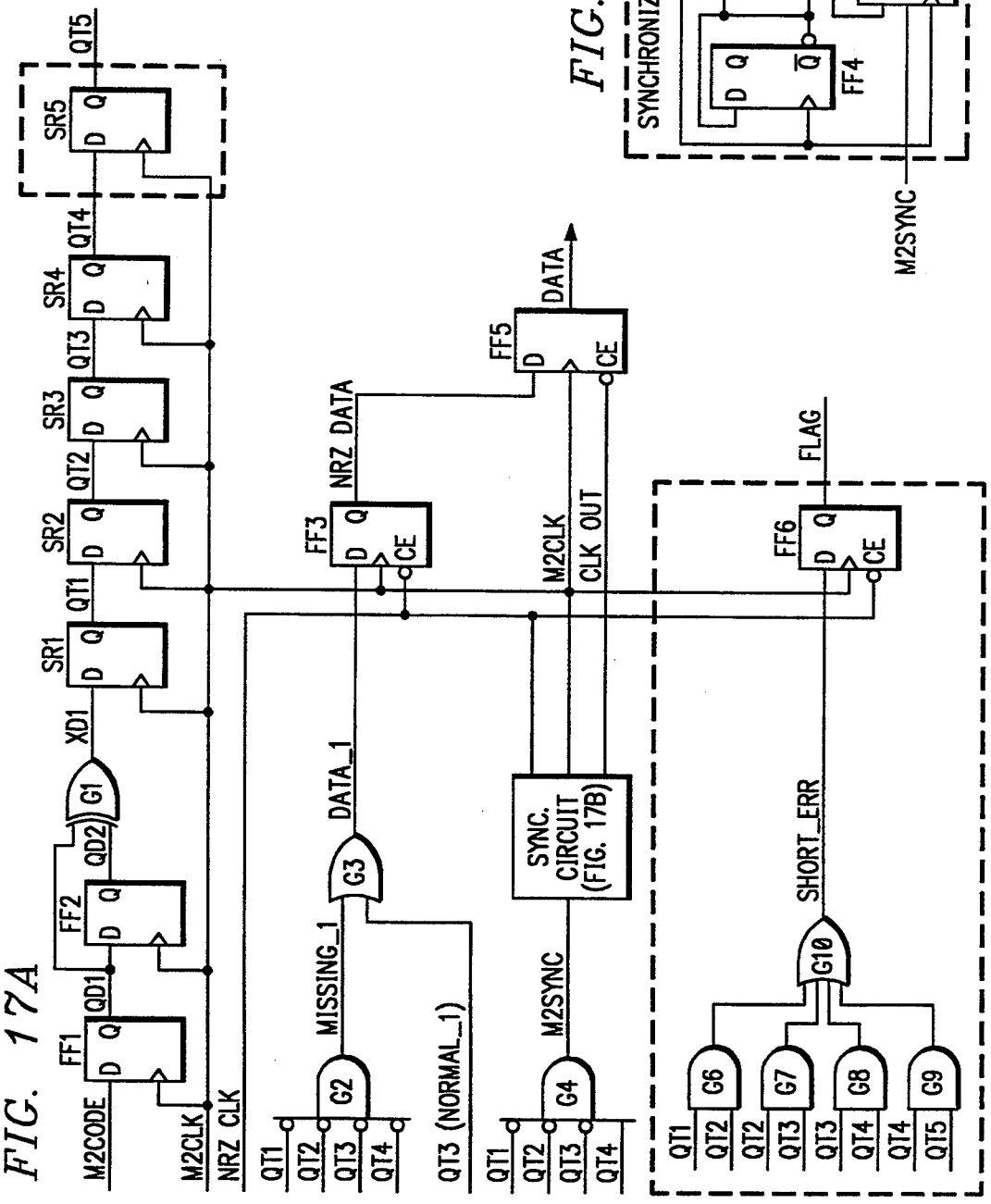
FIG. 17B
FIG. 17A

NOTE: ? = UNCERTAIN DATA DUE TO PLAYBACK ERROR(S).

TRIPLE ORTHOGONALLY INTERLEAED ERROR CORRECTION SYSTEM

TECHNICAL FIELD

The present invention relates to an error detection and correction system for digital data recorded in a storage device or transmitted through a communications channel, and in particular to a system utilizing a triple orthogonally interleaved error correction code for detecting and correcting errors in stored or transmitted digital data.

BACKGROUND OF THE INVENTION

There are many applications where large volumes of digital data must be transmitted and/or stored and received and/or recovered substantially error free. For example, it is imperative that computer data base information, such as social security information, corporate sales and financial data, as well as satellite communications and research data, such as seismic or weather data, be transmitted and stored accurately.

Digital data is typically composed of binary units called "bits" with a group of bits (normally 8) making up a data "byte" or "symbol". Groups of bytes (normally 2) make up a data "word" or may alternatively be arranged into "blocks" of data (28 or 32 byte blocks are common). The errors that typically occur in the transmission, storage, reception and recovery of this data are of two types. The first type, termed a "random" or isolated error, occurs in a single bit when there is a substitution of one value, in a two value binary bit system, for its opposite value. The second type, termed a "burst" error, occurs when a continuous sequence of adjacent bits are in error. The length and frequency of burst type errors may be either random or systematic. In either case, the relative occurrence of these errors is generally a function of the media or channel employed.

Accurate transmission or storage and reception or recovery of digital data has historically been difficult because the media channels utilized for transmission or storage of data are plagued by error introducing factors. For example, such errors may be attributable to transient conditions in the storage device or transmission channel (noise, for example), or may be recurrent conditions resulting from defects in the channel, storage device or recording media. The existence of transient conditions or defects result in instances where the digital data is not transmitted or recorded properly or cannot be reliably received or recovered. Considerable attention has been directed toward discovering methods for reducing the transmission and storage errors that typically accompany data storage and transmission activities.

For example, it is well known in the art to employ error correction codes (ECCs) and other means to locate, counteract, correct and/or eliminate these errors. Such codes comprise additional or redundant bits periodically appended to discrete portions of the transmitted or stored data stream. The redundant bits are added to the discrete portion of the data stream to form code words. This well known process used to counter the occurrence of errors is commonly referred to as "encoding". Once encoded, the random errors in the transmitted or stored data stream are easily located and corrected by well known mathematical means. This process is commonly referred to as "decoding." Decoding typically involves utilizing the appended redundant bits as a parity check against the associated discrete portion of the data stream to detect and correct introduced errors.

Although many different error correction codes exist, the Reed-Solomon (R-S) code system is perhaps the most popular and commonly used symbol coding system. A "symbol" as used herein is comprised of m bits; with m being two or more bits and typically equal to eight bits in which case each symbol is equal to a data byte. An (N,K) R-S code is a code wherein K symbols of user data (data word or code group) have N-K error correction (parity check or code) symbols appended thereto to define a code word having a length of N symbols. The resulting N symbol code word can correct a minimum of T symbols of data error within the code word where $T=(N-K)/2$. For example, a (38,30) R-S code has a code word of 38 symbols in length and a data word (code group) of 30 symbols in length. Thus, there are eight parity check (code) symbols that enable a minimum of four errors to be corrected in each code word.

Decoders for R-S coded transmissions are well known in the art. These decoders process received code words and perform detection and correction processes on the data symbols according to the code symbols to output corrected code groups. Following correction, the parity check (code) symbols are stripped from the code word and the corrected data word (code group) is output. R-S codes can only correct T errors because it takes two code symbols to detect and correct one error. However, the R-S decoder also has the capability of showing within a known probability that the detection and correction capability of the decoder has been exceeded and that errors still exist in the output code group. Thus, the R-S decoders also include outputs that become active when the error correction capability of the decoder is exceeded.

The signals that appear at this additional decoder output are termed "erasure flags" where each flag is associated with a code word believed to still contain one or more errors. Typically, these erasure flags are used by subsequent decoders to assist in the correction of the flagged data in error. Erasure flags are beneficial because it requires only one code symbol to correct a flagged data error. Use of the erasure flags by subsequent decoders can thus enhance the correction capability of the decoder from a minimum of T to a maximum of 2T errors.

Furthermore, it is well known in the art to employ an interleaving process either before or after encoding to provide additional protection against included errors. Interleaving is a process performed on the transmitting or recording side of a system wherein consecutive bytes of digital information in the original data stream are separated from each other. Thus, bytes of digital information which were not adjacent prior to interleaving are concatenated and output as a new bit stream. Interleaving of data streams makes it less likely that consecutive bytes of digital information in the original stream will be adversely affected by a subsequent burst error as the burst error affects concatenated bytes from different portions of the original data stream. In the subsequent deinterleaving process, burst errors are effectively broken up and corrected in a piecemeal fashion by interleaving uncorrupted data from locations outside of the burst error into the bit stream.

The prior art discloses the use of both error correction coding and interleaving systems in combination to provide increased protection against random and burst errors encountered during data transmission and storage operations. For example, Deng, et al. describe a dual, interleaved error correction system in an article entitled *Reliability and Throughput Analysis of a Concatenated Coding Scheme*, published in IEEE Transactions on Communications, Vol. Com-35, No. 7, July 1987. In implementing the Deng, et al. system, encoding of the concatenated code is achieved in three steps. This three step process is figuratively shown in FIG. 1 of the article (reproduced herein as FIG. 1). First, a data message of a fixed number of bits is encoded into a code word by means of a first, outer encoding system. The code word is then interleaved, and after interleaving is encoded by a second, inner encoding system and output for transmission or storage by the media channel. Such an interleaved coding system has also been referred to as a cross-interleaved coding system and primarily used with an R-S code for the outer and inner coding systems. Systems such as that shown in FIG. 1 are well known in the art and commonly referred to by the acronym CIRC (Cross-Interleaved Reed-Solomon Code).

The use of multiple encoding steps and multiple interleaving steps, separately or in combination, to improve error detection and correction capability is disclosed by several published patents. For example, U.S. Pat. No. 3,786,439 issued to McDonald, et al. and Japanese patent No. 55-35562 are considered illustrative of simple triple encoding schemes. The patent issued to McDonald, et al., discloses a triple encoding scheme whereby a first encoder operates on segments of the data stream, a second encoder operates on groups of encoded segments and a third encoder operates on the encoded groups. In the Japanese patent, two error correction codes are appended onto a portion of the data stream, the dual encoded appended data stream further being encoded by a third encoder for appending of a third code and output. U.S. Pat. Nos. 4,730,321, issued to Machado, and 4,567,594, issued to Deodhar, are considered illustrative of simple triple interleaving schemes. Use of multiple encoding and interleaving steps provides improved detection and correction capability for encountered random and burst type errors.

Prior to outputting the encoded and/or interleaved data stream, it is well known in the art to use a media channel encoder on the data stream to counter the errors typically introduced by the use of certain transmission or recording media (for example, a digital tape recorder). The media channel encoding scheme is typically a run-length limiting code that protects against data sequencing errors. One such media channel encoding scheme known and widely used in the art is referred to as Miller-Squared encoding as described in U.S. Re. No. 31,311 issued to Miller. The conventional Miller-Squared decoder simply converts (decodes) the media channel encoded data stream for output.

The drawback associated with these prior art run-length limiting media channel decoders is that the decoded data stream is not checked for any errors introduced by the media channel. Thus, these unidentified errors are passed on to the subsequent decoding and deinterleaving steps. Because of the inherent limitations of the subsequent error correction decoders, the unidentified data errors introduced by the media channel may not be detected or even if detected, not corrected.

In summary, the more error correction code symbols added to the data, the more accurate the ability of the system to detect and correct included errors. However, the most significant drawback associated with multiple encoding schemes, such as the CIRC scheme, is that each encoding step adds redundant symbols to the data stream which occupy space that would otherwise be devoted to the user data. The current state of the art in error correction schemes does not present a scheme that accurately handles large volumes of digital data for transmission or storage while minimizing the number of included symbols devoted to error detection and correction.

SUMMARY OF THE INVENTION

In accordance with the present invention there is provided a triple orthogonally interleaved error correction system to detect and correct errors in data transmissions through the use of relatively few error correction symbols in proportion to the amount of user data transmitted. In accordance with the broader aspects of the present invention, the data stream to be transmitted or stored is encoded by a first error correction encoder to form a series of code words. The code words are input to an interleaver where the code words are orthogonally interleaved. A second error correction encoder then encodes the series of code words. The code words are further processed by a second interleaver and subsequently encoded by a third error correction encoder. The triple orthogonally interleaved encoded data is then ready for transmission or storage through a chosen media channel. On the reception or play back side of the system, the data is recovered from the media channel and processed by a corresponding series of decoders and deinterleavers in reverse order from the transmission and storage side to recover the user data stream and correct any introduced errors.

In particular, the data stream to be transmitted or stored is input into the system and first processed by a first error correction encoder that divides the raw data into a series of code groups comprised of K symbols per group, wherein each symbol is comprised of eight data bits (one byte). The first encoder generates a first error correction symbol (C3) that is appended onto its associated code group of symbol length K to form a code word of symbol length N. The C3 error correction symbols generated for each code word can correct up to T erroneously transmitted or stored symbols, wherein $T=(N-K)/2$.

After the C3 error correction symbols are appended, the generated code words are stored in the columns of an outer interleaver as a first series of two-dimensional "data planes." Thus, each column of the outer interleaver is comprised of an integral number of C3 encoded code words of symbol length N, with each row of each column containing a integral number of individual data symbols or correction symbols.

Prior to generating the next error correction symbol (designated the C2 symbol), the rows of the first series of data planes are orthogonally shuffled by the outer interleaver to generate a second series of data planes. Interleaving in this manner protects the data from loss due to very large burst type errors. During this orthogonal shuffling process, each row preferably maintains its row position on the second series of data planes. For example, if the first row from the first data plane of the first series is shuffled, then the first row will occupy the first row in the designated destination data plane of the second (shuffled) series.

Following the outer orthogonal interleave, the columns of code words are output from the outer interleaver and processed by a second error correction encoder where the second error correction symbol (C2) is appended to each orthogonally interleaved code word. The C2 encoded code 10 words are then written into columns of a data plane in a second (inner) interleaver. The rows of the data plane in the inner interleaver are then sequentially output to perform an interleaving process on the C2 encoded code words. The second interleaving step provides protection against burst type errors of moderate length.

Following the inner interleave, the rows of symbols in the second series of data planes are processed as code words by a third error correction encoder. Through this processing, a third error correction symbol (C1) is appended to the rows of symbols transversely to the other code symbols to generate a final series of data planes of C1 encoded code words. The C1 encoded data is then passed on for transmission or recording by the media channel.

Enhanced error detection and correction is provided by further encoding the final series of data planes, prior to input in the media channel, using a run-length limiting code such as a Miller-Squared code. When a run-length limiting encoder is used, a corresponding decoder must be used on the reception or play back side. The decoder used in the present invention is an improved Miller-Squared decoder that generates sequence violation (S.V.) flags signalling the occurrence of offending data sequences in the data stream that have been introduced by the media channel. These violation flags are used as erasure flags by the decoders on the receiver or play back side to assist in the further detecting and correction of errors in the data stream.

On the receiver or play back side, a first error correction decoder receives the C1 encoded code words and any generated media channel sequence violation flags, corrects any present and correctable error containing data symbols and strips off the C1 code symbols. With the sequence violation flags, the C1 decoder need use only one C1 code symbol to correct the flagged error rather than two as required for correction of previously undetected errors. Not all errors present and detected in the received or played back code words are corrected by the C1 decoder. However, for each uncorrectable error detected by the C1 decoder, a C1 error flag is output to identify the location of each row that still contains one or more uncorrected errors. The sequence violation flags and C1 error flags are then logically combined to generate a C1·S.V. symbol accurate error flag to more particularly and precisely point to (flag) included errors uncorrected by the C1 decoder.

The C1 decoded code words (C1 code groups) are then written into the rows of an inner deinterleaver as a data plane along with the C1·S.V. error flags. The inner deinterleaver deinterleaves the data by sequentially outputting the columns of data. The deinterleave performed is opposite the interleave performed by the inner interleaver on the transmit side of the system. The columns of C1 decoded code words (C1 code groups) are output such that the C2 and C3 error correction symbols are appended to the proper C2 code groups in an order corresponding to the data output from the C2 encoder on the transmit/record side. Also included with each output column are the deinterleaved C1·S.V. error flags providing an indication of places within each column (row location) containing an error uncorrected by the C1 decoder.

The data is next processed by the C2 decoder, which uses the C2 code symbols and the C1·S.V. error flags to detect and correct as many errors as possible. The C2 decoder then strips the C2 code symbols from the code words and outputs the C3 code groups. The range of errors correctable by the C2 decoder is extended by the C1·S.V. error flags as flagged errors require only one code symbol for correction. If either a flagged error or a detected C2 error is not corrected by the C2 decoder, a C2 error flag is output to designate columns or code words that contain detected but uncorrected errors. The C1·S.V. and C2 error flags are then logically combined to generate a C1·C2 symbol accurate flag that will identify for the subsequent C3 decoder symbols that remain in error.

The decoded C2 code words (C2 code groups), along with the C1·C2 symbol accurate flags, are then written into the columns of an outer deinterleaver as a series of data planes. The outer deinterleaver then unshuffles the rows of the orthogonally interleaved series of data planes to generate data planes corresponding to the first series of data planes of the outer interleaver on the transmit/record side. The decoded C2 code words (C2 code groups) stored in the outer deinterleaved data planes are output by column in sequence to a C3 decoder with the appended C3 error correction symbols.

As each column of the inner deinterleaved array is processed by the C3 decoder, the C1·C2 symbol accurate error flag is also read to identify each symbol within the C3 code words containing a detected but uncorrected error. The C3 decoder then detects and corrects as many included errors as possible, strips off the C3 code symbols from the code words and outputs a data stream substantially, if not exactly, corresponding to the original user data symbols (data stream) first input into the C3 encoder on the transmit/record side.

With the triple orthogonally interleaved error correction process of the present invention utilizing media channel S.V. flags, C1·S.V. flags and C1·C2 flags, the range of correctable data symbols is extended and maximized from T to 2T as each error correcting decoder advantageously utilizes erasure flags to permit error correction through use of a single code symbol. Thus, the corrected data stream as output from the system is substantially error free. Any symbols containing errors after the C3 decoding and correction process may be flagged by the C3 decoder for further processing if necessary.

The quality and accuracy of the data stream stored or transmitted via the media channel is further improved through the use of a read-while-write circuit coupled to the triple orthogonally interleaved error correction system of the present invention. With the read-while-write, the sequence of triple orthogonally interleaved encoded data planes are immediately read and decoded as written to the media channel and the number of C1 and C2 error flags are counted. If the number of flags counted exceed a predetermined threshold level, set to provide a margin for transmission or playback deterioration, the read-while-write circuit causes the error containing block of data to be rewritten to the media channel by triggering the transmit or record side to reread, re-encode and retransmit or rerecord the data in error.

BRIEF DESCRIPTION OF THE DRAWINGS

A more complete understanding of the triple orthogonally interleaved error correction system of the present invention may be had by reference to the following Detailed Description when taken in conjunction with the accompanying Drawings wherein:

FIG. 1 is a block diagram of a prior art cross-interleaved (CIRC) error correction encoder system;

FIG. 2 is a block diagram of one embodiment for the triple orthogonally interleaved error correction system of the present invention;

FIG. 8 is a depiction of a data plane of C2 code words as output from the C2 encoder and input into the memory buffer of the inner interleaver circuit;

FIG. 9 is a depiction of a data plane of C1 encoded code words as output by the C1 encoder;

FIG. 10 schematically illustrates a helical scan magnetic tape;

FIG. 11 is a depiction of a data plane with erasure flags as output from the C1 decoder;

FIG. 12 shows either a single C1 or C2 code word;

FIGS. 13A, 13B, 13C, 13D, 13G, and 13F depict the processing steps for the C1 and C2 code words and erasure flags to generate a symbol accurate flag;

FIG. 17A is a block diagram of a $M^2$ decoder in accordance with the present invention including circuitry for detecting and flagging short run errors;

FIG. 17B is a block diagram for the synchronization circuit for a $M^2$ decoder;

DETAILED DESCRIPTION OF THE DRAWINGS

Referring now to FIG. 1, there is shown a prior art dual interleaved error correction system. In implementing the dual interleaved error correction system, encoding of the concatenated code on the transmit or record side is achieved in three steps. First, a data message of a fixed number of bits is encoded into a code word by means of a first, outer encoder 2. The code word is then interleaved by an interleaver 4. Finally, the code word is encoded by a second, inner encoder 6 and transmitted over the media channel 8 for transmission or storage. On the receive or play back side, decoding of the transmitted data is accomplished by receiving the data from the media channel 8 and performing corresponding decoding and deinterleaving steps in a complementary three-step order. Such an interleaved coding system is primarily used with an R-S coding scheme for the outer and inner encoding and decoding systems and referred to as a cross-interleaved Reed-Solomon coding system (CIRC). Error detection and correction encoding (and decoding) processes and circuits are well known in the art.

An (N,K) R-S encoder takes a code group comprised of K symbols and then calculates and appends N-K error correction code symbols to generate a code word N symbols in length. The code symbols are generated in a well known manner using specified generator (encoding) polynomials and Galois Fields as described in U.S. Pat. No. 4,567,594, issued to Deodhar. The appended code symbols provide the capability of detecting and correcting T errors in the code word, wherein $T=(N-K)/2$. Correction of more than T errors (up to a maximum of 2T errors) is possible with the use of erasure flags as will be discussed herein.

Figure 15:
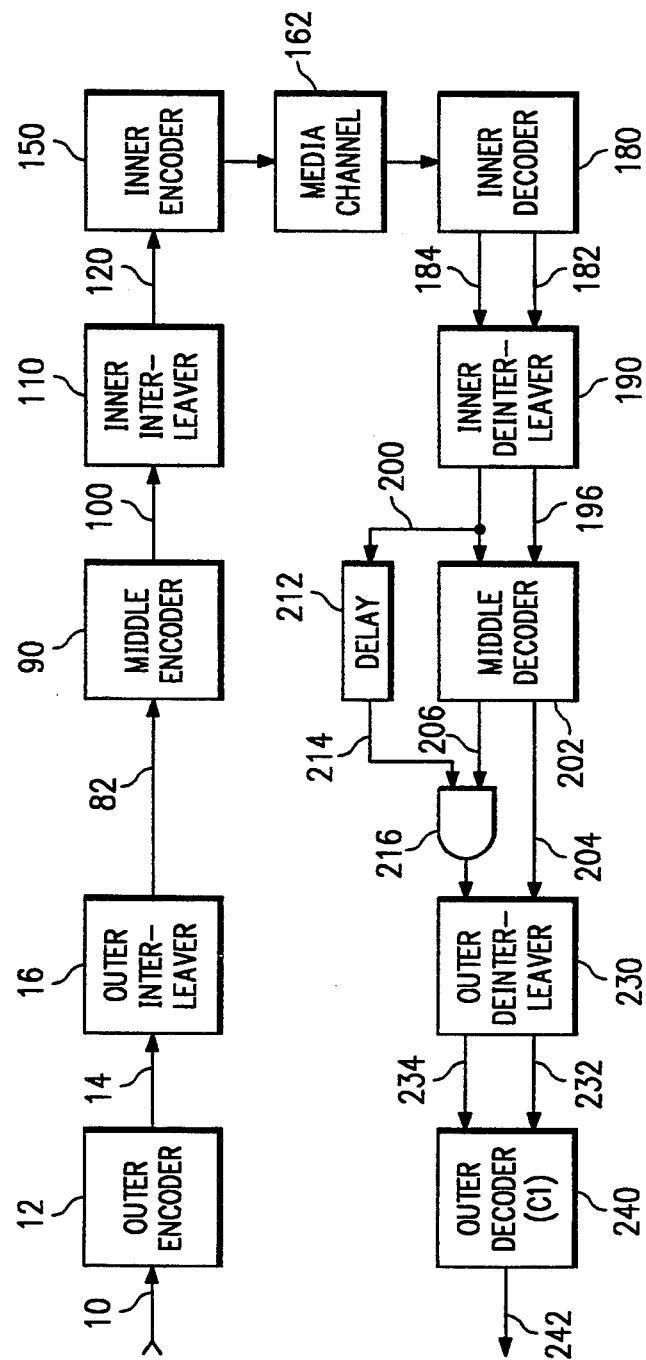
FIG. 15 is a block diagram showing an alternative embodiment of the system without media channel encoding and decoding.
Figure 16:
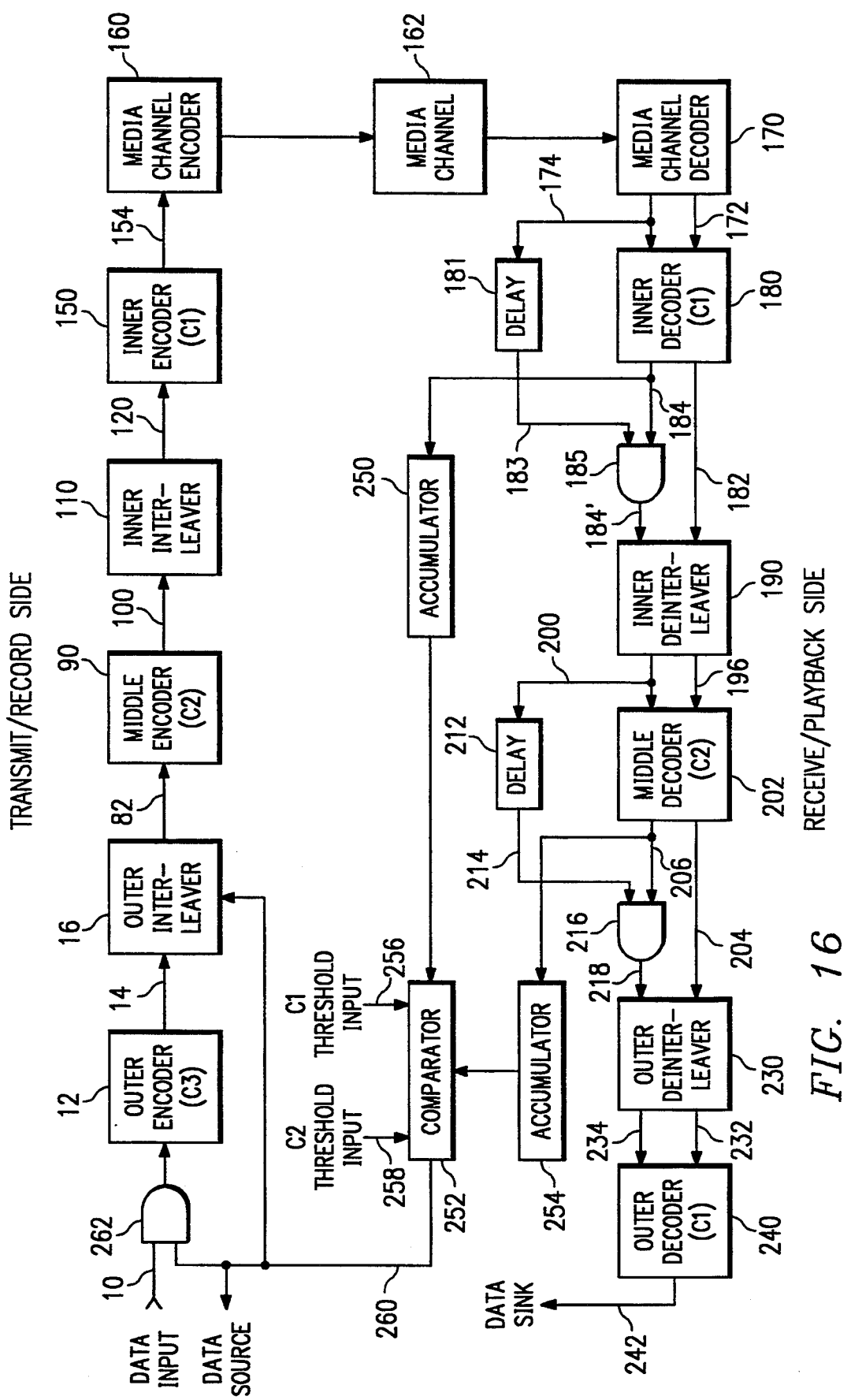
FIG. 16 is a block diagram showing the preferred alternative embodiment of the system for maximizing error correction capability and enabling a read-while-write function.

Referring now to FIGS. 2, 15 and 16, there are shown block diagrams for several embodiments of the triple orthogonally interleaved error correction system of the present invention. FIG. 16 illustrates the preferred embodiment for providing maximum protection against, and correction of included data errors. The systems illustrated each comprise a transmit or record side at the top of each figure and a receive or play back side at the bottom of each figure. Communication between each side of the system occurs over a media channel on the right hand side of each figure. It is typically the media channel that introduces errors into the data transmission.

With reference now specifically to FIG. 2, user data for transmission or storage is received on the transmit/record side of the system from a data source on line 10. The user data is generally a stream of eight bit symbols received in parallel format. It will however be understood that data in other formats, for example, a serial format, may be received and processed by the system.

In the transmit/record side of the system, three orthogonally interleaved sets of error correction codes (C3, C2 and C1) will be calculated and appended to the user data. These three error correction codes will be in symbol format and will be appended to groups of user data symbols or other code groups formed by the system to form code words. Each error correction code symbol is generated by an encoder that produces a unique code symbol according to well known processes utilizing the user data symbols in each group and a specific coding polynomial.

The user data symbol stream input on line 10 for transmission or storage is first divided into a sequence of user code groups, each group containing a predetermined amount of user data in symbol format, by an outer encoder 12. The length, in number of symbols, of each code group of user data is determined and set by the system and may be programmed into the encoder 12.

Each user data code group in the user data sequence is then processed by the outer encoder 12 which calculates a first error correction code (hereinafter referred to as a C3 code) in the form of one or more symbols that are appended to the user data code group to generate a C3 encoded code word. The outer encoder 12 is preferably an (N,K) Reed-Solomon encoder, but can be any other encoding system or apparatus that generates and appends error detection and correction symbols based on a subset (code group) of the user data symbols.

The output from the outer (C3) encoder 12 on line 14 comprises a sequence of C3 encoded code words (user code group plus C3 code symbols). The sequence of C3 code words on line 14 is stored in a two-dimensional memory array of an outer interleaver 16 as a first series of data planes. Each data plane comprises m columns, each column containing n elements or rows. It will of course be understood that "n" referring to the number of elements in each column of the array, and "N" referring to the number of symbols in a code word, do not necessarily represent the same number. However, in the preferred embodiment of the invention, the number of symbols "N" in a code word equals the number of rows "n". Thus, the sequence of C3 code words are sequentially written, one code word per column, into adjacent columns of consecutive data planes. Consider, for example, a code sequence containing 20 code words each word having 15 symbols and a memory area storing two data planes each plane having ten columns (m=10) and fifteen rows (n=15). With this example, the first ten code words in the sequence would be written into the ten columns of the first data plane one symbol per row, 15 symbols (one code word) per column with the second ten code words being written in a similar manner into the ten columns of the second data plane.

Figure 3:
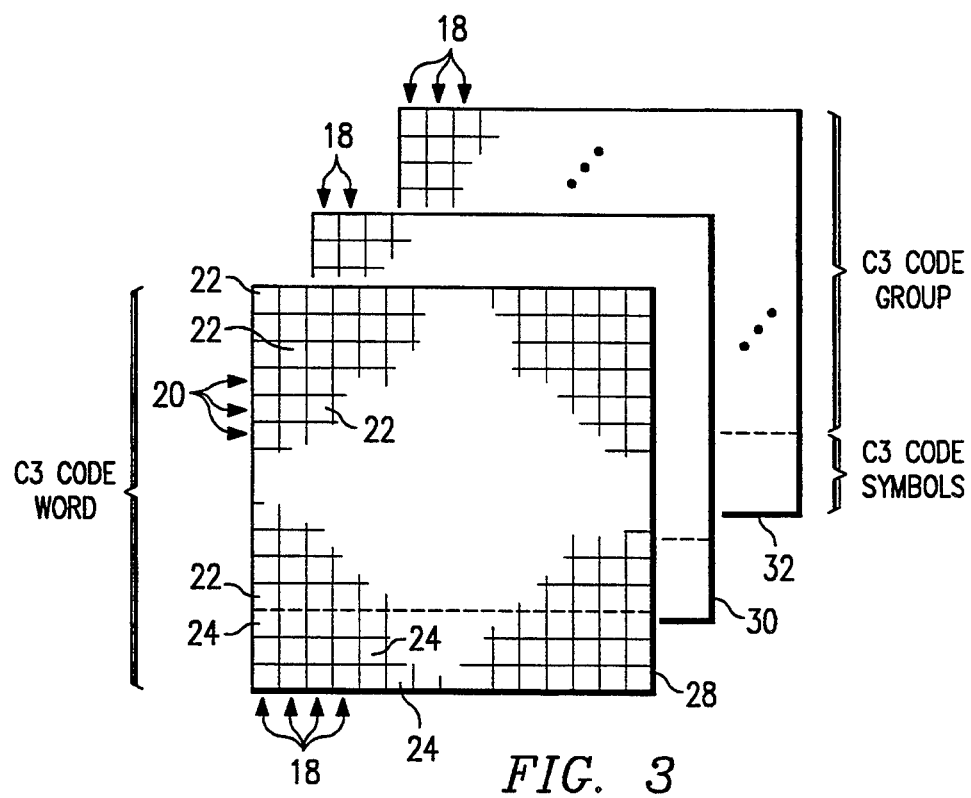
FIG. 3 is a pictorial representation of the series of data planes in the outer interleaver in which individual C3 encoded code words are stored in consecutive adjacent columns.

The storage process performed by the interleaver 16 can be better understood by reference to FIG. 3 which depicts a series of three data planes in the outer interleaver 16, each data plane having a number of columns 18 and rows 20. The rows 20 of each column 18 contain user data symbols 22 and appended C3 error correction code symbols 24. The first C3 code word in the sequence is stored in the first column of the first data plane 28. The following C3 code words in the sequence of C3 encoded code words are sequentially stored in a similar fashion from left to right in the remaining columns 18 in the first data plane 28. After the first data plane 28 is filled with C3 code words in the manner described, the outer interleaver 16 moves on to sequentially store following C3 code words in the next adjacent data planes 30 and 32.

The purpose of the outer interleaver 16 in FIG. 2 is to orthogonally shuffle (interleave) the rows of the stored series of data planes to generate a second series of data planes. Interleaving in this manner provides protection against very large burst type errors by concatenating nonadjacent code words and widely separating adjacent code words. A better understanding of the orthogonal interleaving process may be had by reference to the following description when taken in conjunction with the illustrations in FIGS. 4A and 4B.

Figures 4A, 4B:
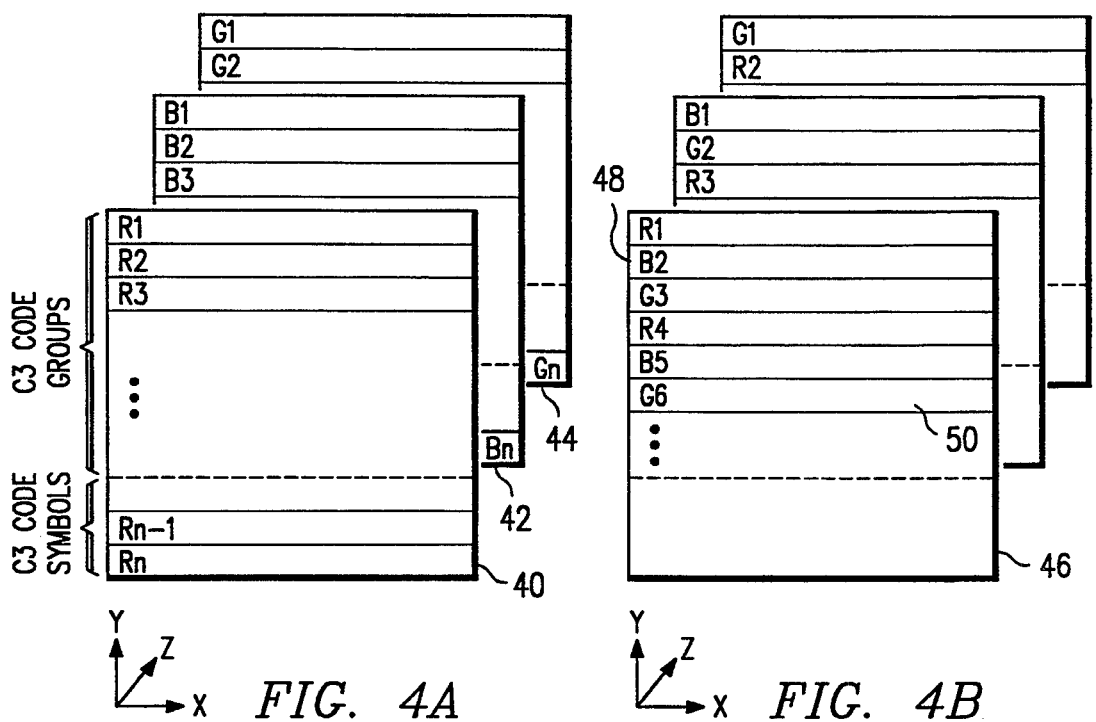
FIGS. 4A and 4B are pictorial representations of the series of data planes illustrating orthogonal shuffling.

Each data plane shown in FIG. 4A comprises a plurality of rows of user data symbols and a plurality of rows of C3 code symbols generated during the C3 encoding step. The colors red, blue and green are assigned to the data planes so that the orthogonal row shuffling process may be more easily described and clearly observed. The rows of the red data plane 40 are sequentially labeled as R1, R2 ... Rn. The same is true for the rows of the blue data plane (Bn) 42 and green data plane (Gn) 44. The rows of error correction code symbols are labeled consecutively following the user data symbol rows because the C3 parity symbols and data symbols are treated equally by the interleaver 16.

Orthogonal interleaving of the rows in the data planes is accomplished by the interleaver 16 by a row shuffle interleave process that shuffles rows between data planes (interplane shuffle) rather than shuffling inside a single data plane (intraplane shuffle). According to a predetermined interplane shuffling algorithm stored in a look-up table in the outer interleaver 16, individual rows of the data planes are selected, shifted to another predetermined data plane to displace and replace a row in that plane.

This interplane shuffling process creates a new (second) series of data planes (see FIG. 4B), each data plane comprised of rows of symbols taken at various depths from a plurality of data planes in the first series. Thus, each data plane in the new plurality of data planes is orthogonally interleaved from the planes in FIG. 4A and comprises a mixture of red, green and/or blue rows. The term "orthogonal interleaving" is used to describe this shuffling algorithm because the z axis across which the rows are shuffled (interplane) is orthogonal to the x-y plane that is coplanar to each data plane from which the rows are taken.

In the preferred embodiment of the invention, the interplane orthogonal shuffling algorithm maintains the same row position for each shuffled row after transfer to the new plurality of data planes. This is best illustrated in FIG. 4B wherein the first series of red, blue and green data planes (reference numerals 40, 42 and 44, respectively) of FIG. 4A are shown following the interplane orthogonal shuffling performed by the interleaver 16. The first data plane 46 in FIG. 4B (second series of data planes, corresponding to the red data plane 40) comprises rows taken from each data plane in FIG. 4A. As can be seen, each shuffled row has maintained its same row position. For example, the second row 48 in orthogonally shuffled data plane 46 contains the second row of the blue data plane 42 (B2). Likewise, the sixth row 50 contains the sixth row of the green data plane 44 (G6). Similar shuffling according to the shuffling algorithm occurs for the rows containing the C3 code symbols, and thus the code symbols, even after orthogonal interleaving, will remain at the bottom of the data planes.

Figure 5:
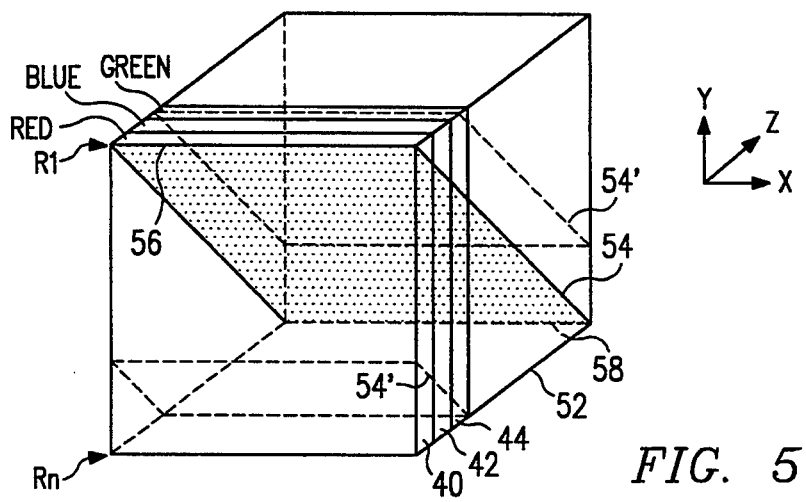
FIG. 5 is a pictorial representation of a data block illustrating a particular row maintaining interplane orthogonal shuffling sequence implemented by the outer interleaver.

The data cube 52 shown in FIG. 5 illustrates one particular interplane shuffling algorithm that maintains row position. It will of course be understood that other shuffling algorithms are available. The data cube 52 contains a plurality of data planes, representing the sequence of data planes in the interleaver 16, of which only the first three, corresponding to the red (40), blue (42) and green (44) data planes of FIG. 4A, are shown. Also shown is a diagonal plane 54 representing the shuffling sequence or algorithm for dispersing the rows of a chosen data plane over the data cube 52. As shown, the diagonal plane 54 illustrates a dispersing of the rows of the first (red) data plane 40. Accordingly, the first row (R1) at the upper front edge 56 of the cube 52 will remain as the first row of the first data plane following shuffling. However, the last row (Rn) of the first data plane will be orthogonally shuffled by the diagonal plane 54 to become the last row of the last data plane at the lower back edge 58 of the cube 52. Dispersing of rows from other data planes (blue 42, green 44, etc.) by the diagonal plane 54 can be illustrated on the cube by simply shifting the diagonal plane sequentially plane by plane in a rearward direction, as shown by dotted diagonal plane 54' (shown dispersing green data plane 44), to disperse the rows of each subsequent data plane.

The row shuffling algorithm implemented by the interleaver 16 is programmed into the interleaver in accordance with the chosen media channel in order to optimize the available protection against burst errors. For example, if the media channel is susceptible to burst errors of a length x, where x is either physical space or time, then the shuffling algorithm will cause adjacent symbols in a column to be separated by at least x distance. With this separation, a burst error of less than x duration will not adversely affect the data as the error can be corrected by the decoder following interleaving of uncorrupted data into the data stream from outside the error.

While the orthogonal interleaving algorithm has been illustrated herein to provide interplane shuffling while maintaining relative position (row location) of the shuffled rows, it will be understood that other interplane shuffling algorithms may be implemented. For example, the algorithm could provide for interplane shuffling in a pseudo-random manner, or in any other manner as defined by a given mathematical sequence. In choosing the shuffling algorithm, it is important that the chosen alternative interleaving algorithm provide sufficient spacing of the code words in space and time to protect against the anticipated types of burst errors encountered with use of the chosen media channel.

Figure 6:
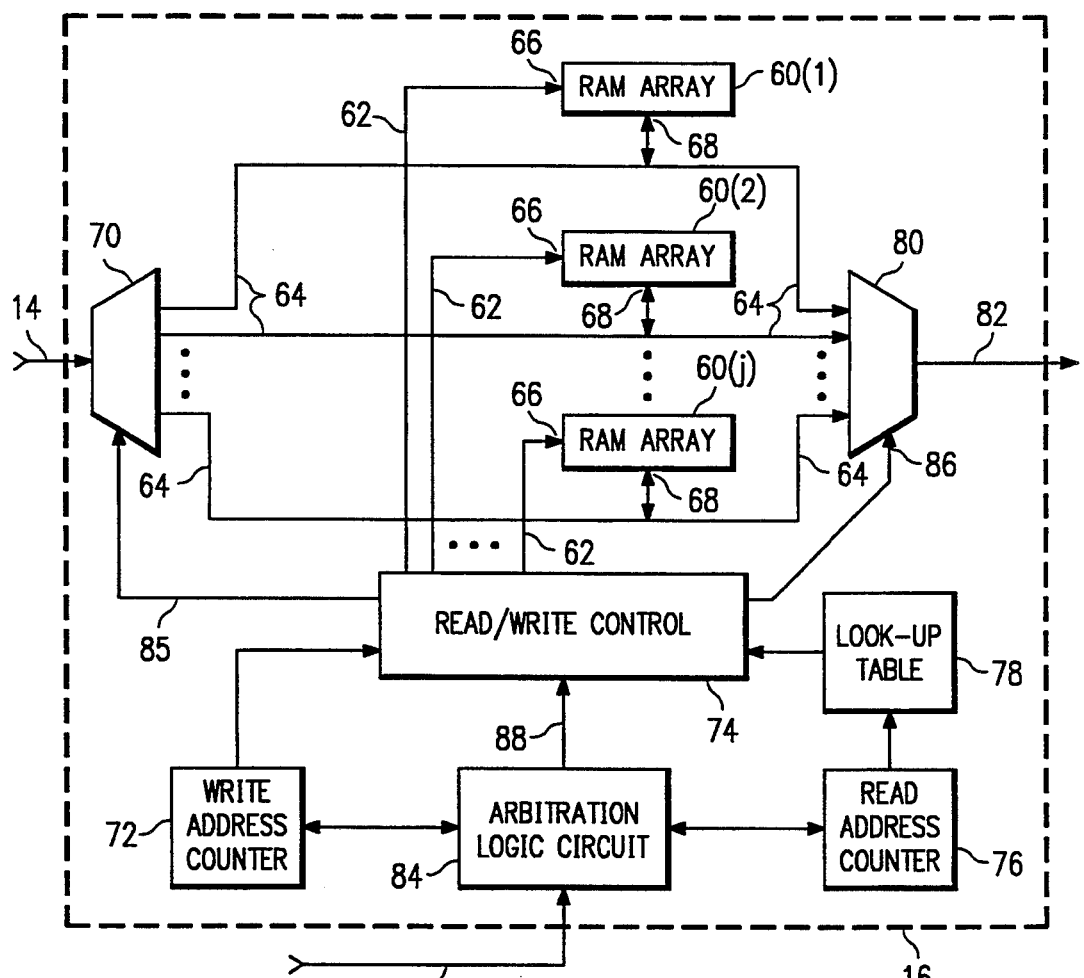
FIG. 6 is a block diagram of the outer interleaver circuit.

Referring now to FIG. 6, there is shown a block diagram of an interleaver circuit similar to that used in the outer interleaver 16 of the present invention. Random access memory (RAM) arrays, 60(1) to 60(j), are provided in the interleaver circuit as storage areas for the j two-dimensional arrays of m columns and n rows needed for storing the sequence of code words in the plurality of data planes required for interplane orthogonal shuffling. Each memory array 60 is connected to an address bus 62 and a data bus 64. The address bus 62 is coupled to an address port 66 of each array 60, and the data bus 64 is connected to an input/output port 68 of each array 60.

A write multiplexer 70 receives the sequence of C3 encoded code words over line 14 from the C3 encoder 12 (FIG. 2) and writes individual code words into selected memory arrays 60 according to the memory addresses sequentially generated by a write address counter 72 and read/write control circuit 74. The input/output port 68 of the chosen memory array 60 is activated by signals on the address bus 62 from the write address counter 72 in accordance with operation of the circuit 74. Typically, the write address counter 72 causes the incoming sequence of code words to be sequentially stored in adjacent columns of each memory array 60 starting with the first array 60(1) and continuing until array 60(j) is filled.

To output orthogonally interleaved code words from the interleaver circuit (FIG. 6), a read address counter 76, coupled to a look-up table 78 and the read/write control circuit 74, sequentially generates a first sequence of read addresses. These addresses cause sequential access to the contents of the look-up table 78 causing a second sequence of addresses to be applied to the memory arrays 60 by the read/write control circuit 74 over the address bus 62. The addresses present on the address bus 62 cause the selected memory array 60 to access columns in the arrays and output stored code words on the data bus 64. In the present embodiment of the invention, the interleaver utilizes a row maintaining look-up algorithm and the C3 encoded, orthogonally shuffled code words will be output with the C3 code symbol appended to the end of each shuffled code group. In alternative embodiments, the C3 code symbols will be distributed throughout the output code words.

The second sequence of read addresses, as accessed by the first sequence and output to the memory arrays 60, may be programmed into the look-up table 78 in a predetermined order that implements the orthogonal interplane shuffling sequence optimally selected to provide protection against burst errors of the length expected with the chosen media channel. The orthogonally shuffled sequence of code words accessed by the second sequence of read addresses from the memory arrays 60 are output through a read multiplexer 80 on line 82. It will of course be understood that the look-up table need not utilize the row maintaining algorithm, but may alternatively implement any other suitable shuffling algorithm, for example column shuffling, to provide burst error protection.

An arbitration logic circuit 84 controls the switching of the write multiplexer 70, read multiplexer 80 and read/write control circuit 74 via control lines 85, 86 and 88, respectively. The arbitration logic circuit 84 is also coupled to the write address counter 72 and read address counter 76. Arbitration logic circuit 84 operates to insure that the selected read and write addresses as chosen by the write address counter 72 and look-up table 78 from accessing the same address in the same memory array 60 at the same time. This may be accomplished by configuring the plurality of memory arrays 60 as two data buffers selectively accessed by the arbitration logic circuit 84 for writing and reading data. For example, as the memory arrays in the first data buffer are sequentially filled with incoming code words, the memory arrays of the second buffer, which were previously filled with data, are read according to the look-up table sequence and output to accomplish the orthogonal interleaving process. Once a buffer has been completely read from, the interleaver circuit operates to receive the next code word sequence and overwrite the orthogonally interleaved output data in the second buffer. At the same time, the arbitration logic circuit 84 reads and orthogonally outputs the previously stored sequence of code words in the first buffer.

Referring again to FIG. 2, C3 encoded code words orthogonally interleaved by the outer interleaver 16 are output on line 82 and received by a middle error correction encoder 90. The orthogonally shuffled C3 encoded sequence of code words are received by the encoder 90, divided into individual code groups and processed to calculate a second error correction code (hereinafter referred to as a C2 code) in the form of one or more symbols that are appended to each code group to generate a C2 encoded code word. If the outer interleaver 16 utilized a row maintaining interplane shuffling algorithm and if the C2 code groups as divided are equal in length to the C3 code words, then the C2 code symbols and C3 code symbols will be adjacent to each other at the end of each C2 encoded code word (see FIG. 8).

The sequence of C2 encoded code words are output from the middle encoder 90 on line 100.

Encoding in this manner provides enhanced protection against random and burst errors in addition to that protection provided by the outer encoder 16. The middle encoder 90 is preferably an (N,K) Reed-Solomon encoder, but can be any other encoding system or apparatus that generates and appends error detection and correction symbols. However, the middle error correction encoder 90 need not employ the same code type or employ the same encoding polynomial as the outer error correction encoder 16.

Figure 7A:
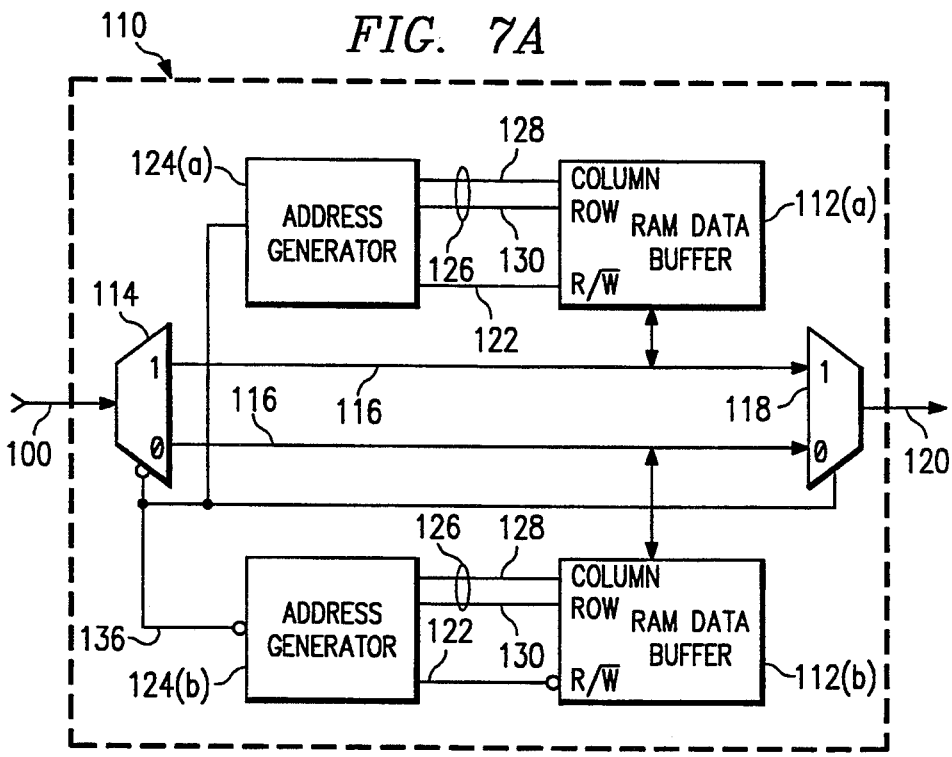
FIGS. 7A and 7B are a block diagram for the inner interleaver circuit.
Figure 7B:
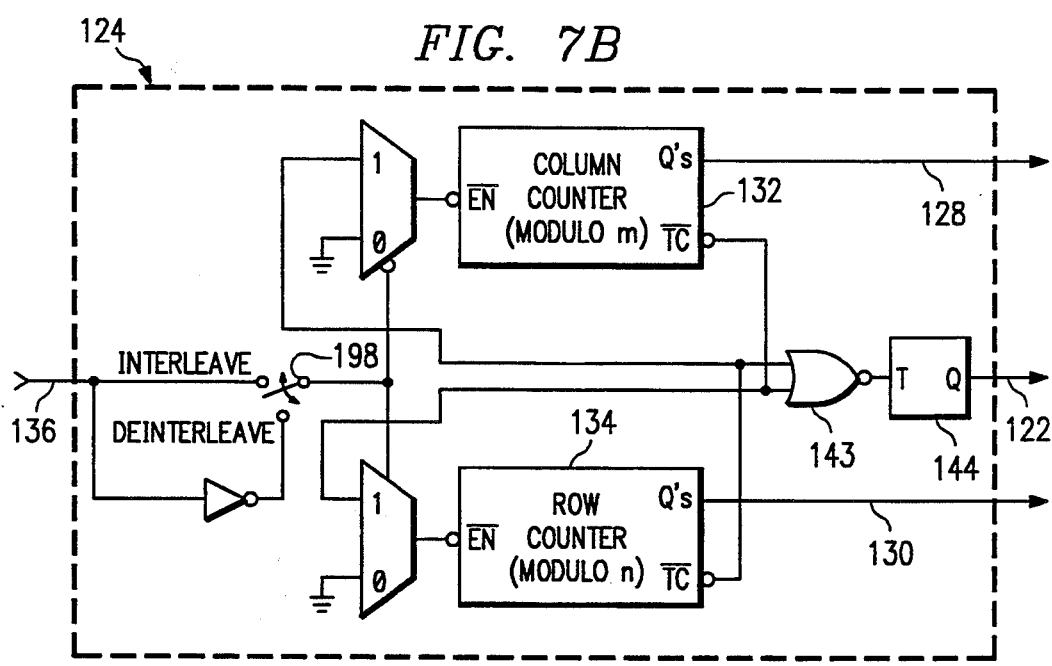

After encoding, the sequence of C2 encoded code words (containing the shuffled user data code groups, shuffled C3 code symbols and C2 code symbols) are output on line 100 to an inner interleaver 110. The inner interleaver 110 utilizes a two buffer switching process similar to the outer interleaver 16 shown in FIG. 6 but utilizes a modified interleaver circuit. A simplified block diagram of the circuit for the inner interleaver 110 is shown in FIGS. 7A and 7B. The interleaver 110 is configured to simultaneously handle both incoming C2 encoded code words and outgoing interleaved C2 encoded code words.

Referring to FIG. 7A, data buffers 112(a) and 112(b) are provided in the interleaver 110 for storing the sequence of C2 encoded code words input over line 100. The data buffers 112(a) and 112(b) are random access memories configured in an array format (m columns by n rows) large enough to hold a single data plane as shown in FIGS. 3, 4A, 4B and 5. The buffers 112(a) and 112(b) are used by the interleaver to simultaneously input C2 encoded code words and output C2 encoded code words in an interleaved fashion.

An input/write multiplexer 114 applies input C2 encoded code words from line 100 on data bus 116 for storage in one buffer, for example buffer 112(a), while an output/read multiplexer 118 takes interleaved data from the second buffer, for example buffer 112(b), for output on line 120. The read/write function for the dual buffer interleave system is controlled by a read/write control signal on line 122 from address generators 124(a) and 124(b). When the write function fills buffer 112(a) with new code words and the read function empties buffer 112(b), the read/write control signal switches to cause the next sequence of code words to be stored in buffer 112(b) while the code words previously stored in buffer 112(a) are output in an interleaved fashion.

As explained, the code word storage and interleaving processes are controlled by outputs from address generators 124(a) and 124(b) coupled to buffers 112(a) and 112(b), respectively. Each address generator 124 is connected to its associated buffer 112 via a read/write line 122 and an address bus 126 comprised of a column address line 128 and a row address line 130.

Referring to FIG. 7B, the address generators 124 consist of two counters, 132 and 134. The column counter 132 counts modulo "m" to provide column addresses for the buffer 112. The row counter 134 counts modulo "n" to provide row addresses for the buffer 112. Thus, the address counter can access every location in the data plane stored in the buffers 112 for storage and retrieval of any individual symbol in a code word.

Referring now to FIGS. 7A and 7B, the accessing of the data locations in the buffers 112 is controlled by a control signal from the write multiplexer 114 applied to the address generators 124 on line 136. When the control signal is logic low, the row counter 134 of the address generators 124 is enabled to continually increment the row addresses. The column counter 132 will be enabled to increment the column address each time the row counter reaches its terminal count (n). When an address generator 124 is applied with a low control signal, the associated buffer 112 is in a write mode thereby enabling input and storage of incoming C2 encoded code words. Conversely, when the control signal from the multiplexer 114 is logic high, the column counter 132 is continually incremented and the row counter 134 will be incremented each time the column counter reaches its terminal count (m). When an address generator 124 is applied with a high control signal, the associated buffer 112 is in a read mode thereby enabling output from storage of interleaved C2 encoded code words.

During a write mode, the address generator 124 causes the incoming C2 encoded code words to be written sequentially into the columns of the buffer data plane 138 as shown by the arrow 140 in FIG. 8. During read mode, the address generator 124 causes the data stored in the buffer data plane 138 to be output sequentially in rows on line 120 as shown by the arrow 142 in FIG. 8. Thus, the buffers 112 are written column by column and read row by row, thereby providing the desired interleaving.

When the column counter 132 and the row counter 134 both reach their terminal counts (indicating a full data plane input or a full interleaved data plane output), a NOR gate 143 and a toggle flip-flop 144 generating the read/write control signal on line 122 cause the control signal to switch and the buffers 112 to change function from read to write or write to read.

Referring again to FIG. 2, the sequentially output rows of inner interleaved C2 encoded code words on line 120 are received by an inner error correction encoder 150. The interleaved C2 encoded sequence of code words are broken up into individual code groups and processed to calculate a third error correction code (hereinafter referred to as a C1 code) in the form of one or more symbols that are appended to the interleaved C2 encoded code word to generate a C1 encoded code word. The code groups processed by the C1 encoder 150 typically have a symbol length equal to the number of columns in the buffer data plane 138 in FIG. 8. Thus, the C1 code symbols will be appended onto the ends of each row in the interleaved data plane 138, transverse to the C2 and C3 code symbols, as the rows of data are received over line 120. The appended, transverse C1 code symbols are shown in data plane 152 in FIG. 9. The rows of the C1 encoded code words are sequentially output from the encoder 150 on a line 154.

Encoding in this manner provides enhanced protection against random errors in addition to that protection provided by the outer encoder 16 and middle encoder 90. The inner encoder 150 is preferably an (N,K) Reed-Solomon encoder, but can be any other encoding system or apparatus that generates and appends error detection and correction symbols. However, the inner error correction encoder 150 need not employ the same code type or employ the same encoding polynomial as either the outer error correction encoder 16 or middle error correction encoder 90.

The amount of user data selected per user code group by the first encoder 12 is limited such that after appending the three sets of mutually orthogonal, interleaved code words, the data plane 152 generated by the triple orthogonally interleaved error correction system will contain the prescribed amount of data (shuffled user data plus C1, C2 and C3 encoding data) as will fit on one track of a helical scan tape recorder. A magnetic tape 156 for a helical scan recorder is schematically shown in FIG. 10. Two helical scan tracks 158, each recording one or more data planes 152 (FIG. 9) are pictorially shown on the surface of the tape 156.

As is well known, digital data is recorded on magnetic media such as tapes by magnetizing small portions of the tape in opposite directions depending on the value of the data (bit) to be recorded (either logic 1 or logic 0). On playback, the changes in direction of the magnetized tape are read and transformed back into the original digital signal.

In recording of the data, the bit string may have transitions that when recorded will create magnetized areas that are for example either too close together or too far apart. If the magnetized areas are too close together, the play back device will have difficulty in distinguishing between and recognizing consecutive bits of data. If the magnetized areas are too far apart, the synchronization clock required for accurate playback and recovery of the recorded data will be lost preventing reproduction of the original signal.

To address these concerns, in the preferred embodiment of the system, the rows of C1 encoded code words output from the inner encoder 150 are processed by a media channel encoder 160 prior to being output onto the desired media channel (for example, tape recorder). The media channel encoder 160 encodes the output rows of C1 encoded code words using a run-length limiting, self clocking code. For example, with a (D,K) run-length limiting code, transitions in the data stream to be recorded on the tape are not allowed to occur any closer than D clock pulses nor farther apart than K clock pulses. If the data sequence to be recorded (or transmitted) violates these, or other sequencing rules peculiar to the chosen encoding scheme, the data sequence is changed through an encoding step so as to not violate the rules. The media channel encoder 160 utilized in the preferred embodiment is a Miller-Squared ($M^2$) encoder as described in U.S. Pat. Re. No. 31,311. A brief description of the $M^2$ encoding rules will be described below. After run-length limiting encoding, the C1 channel encoded code words are output to the media channel 162.

As mentioned above, the system of the present invention is comprised of a transmit or record side as described above and illustrated at the top of FIG. 2 and a receive or play back side as illustrated at the bottom of FIG. 2 communicating over the media channel 162. A conventional media channel decoder 170 on the play back side of the system receives the C1 channel encoded code words from the media channel 162 and decodes the channel encoded data to recover the original channel encoded signal. However, due to tape manufacturing defects, noise introductions or defects in the media channel, the channel encoded data output from the channel may include channel errors. These errors often introduce data transitions into the channel encoded data stream that violate the channel sequencing rules.

With prior art decoders, the included channel errors would be decoded and introduced into the bit stream. This occurred because a run-length limiting decoder, as a general rule, does not have error detection or correction capability. However, the identification of the channel introduced sequence violations would assist in the identification and correction of errors by the C1, C2 and C3 decoders thereby enhancing the performance of the system of the present invention. Thus, the present invention utilizes an improved media channel decoder 170 that detects and flags the sequencing violation errors resulting from operation of the media channel. As the C1 channel encoded code words are decoded by the media channel decoder 170, C1 encoded code words are sequentially output on line 172, and sequence violation flags indicating detected sequence violation errors in the channel decoded data are simultaneously output on line 174.

The media channel decoder 170 outputs sequence violation flags on a per symbol basis for each symbol in each decoded C1 encoded code word output on line 172. Each sequence violation flag on line 174 demarks a symbol that includes a violation of the run-length limiting decoding rules. Both the sequence of channel decoded C1 encoded code words and sequence of identifying sequence violation flags are passed on to a C1 error correction decoder 180. Use of the sequence violation flags to assist in the C1 error correction decoding enhances the error correction capability of the C1 decoder from T to 2T depending upon the degree of reliability of the sequence violation flags. A more complete description of the $M^2$ media channel encoding rules and decoder utilized by the system of the present invention is provided below.

The C1 decoder 180 receives C1 encoded code words and decodes and corrects the C1 code group (C2 encoded code words) using the received channel decoder sequence violation flags as erasure flags. The C1 decoder 180 must use the same coding polynomial to decode the C1 code words as used by the C1 encoder 150 to encode the C1 code groups. The decoded C1 code groups are output by the decoder 180 on line 182. An erasure flag identifies an error whose location is known but whose correct value is unknown. In general, it requires only one code symbol to correct an erasure (detected error), while it requires two code symbols to correct an undetected error (according to the formula $T=(N-K)/2$). Thus, through efficient use of erasure flags, enhanced correction from T to 2T errors is possible.

If the error correction range of the C1 decoder 180 is exceeded, leaving detected but uncorrected symbols in the C1 code group, the decoder outputs C1 erasure flags on line 184. A representative data plane containing C1 code groups (C2 encoded code words) as output on line 182 is shown in FIG. 11. Also shown in FIG. 11 are a plurality of C1 erasure flags, symbolized by arrows 186, generated by the decoder 180 and output on line 184. Each of these C1 flags indicates that somewhere in the plurality of symbols contained in the rows identified by the flags there are one or more symbols containing uncorrected errors. The C1 flags will be used by the system to improve error correction capability in a manner to be described.

The C1 code groups and C1 erasure flags are next received and processed by an inner deinterleaver 190. The received data comprises data planes of the format shown in FIG. 11, each containing shuffled user data, shuffled C3 error correction code symbols, C2 error correction code symbols and the C1 erasure flags. The inner deinterleaver 190 has a structure similar to that shown for the inner interleaver 110 in FIGS. 7A and 7B. The data planes of C2 code words are stored in the deinterleaver sequentially on a consecutive row by row basis. The write direction for storing the C2 code words is shown by the arrow 192 in FIG. 11. To deinterleave, the stored code words are output from the deinterleaver 190 sequentially on a consecutive column by column basis. The read direction for output of deinterleaved code words is shown by arrow 194 in FIG. 11.

The inner deinterleaver 190 utilizes a dual buffer system like that used by the inner interleaver 110. There are, however, two fundamental differences between interleaver 110 and deinterleaver 190. First, the order of writing and reading of the rows and columns is reversed so that the order of symbols input into the interleaver 110 is equal to the order of symbols output from the deinterleaver 190. Thus, one data plane of input C2 encoded code words is connected for storage on a row by row basis in a first buffer while a previously stored data plane of C2 encoded code words is deinterleaved and output on a column by column basis on line 196 from the other buffer.

When the first buffer is filled with a data plane and the second buffer deinterleaves and empties, the deinterleaver 190 switches to cause the next sequence of C2 encoded code words (data plane) to be stored in the second buffer while the code words previously stored in the first buffer are output in a deinterleaved fashion. The storage and output functions of the deinterleaver are controlled by the address generators 124 in FIG. 7A. With reference to FIG. 7B, a toggle switch 198 coupled to the control signal line 136 controls operation of the address counters 124 and determines whether the circuit of FIGS. 7A and 7B operates as an interleaver 110 or deinterleaver 190.

Second, the memory arrays 112 of the deinterleaver 190 incorporate additional memory area for parallel storage of the C1 erasure flags. This allows the erasure flag to be stored in the deinterleaver adjacent to each symbol in the particular error containing row. In the preferred embodiment, each symbol is eight bits wide. Thus, the memory arrays in the deinterleaver 190 are required to hold nine bits, eight for the symbol and one for the flag.

The columns of deinterleaved C2 encoded code words output on line 196 and C1 erasure flags output on line 200 are next processed by a middle error correction decoder 202 that detects and corrects, according to the C2 code words, as many included errors as possible. Again, the use of erasure flags enhances the C2 decoder error correction capability of the C2 decoder 202 from T to 2T. The decoder 202 then strips the C2 code symbols from the C2 code word received on line 196 and outputs the C2 code groups sequentially on line 204. When the number of errors detected by the C2 decoder 202 exceeds the range of correctability of the decoder, C2 erasure flags are generated by the decoder and output on line 206 indicating each column that contains an uncorrected error. The C2 erasure flags, in conjunction with the C1 erasure flags generated by the C1 decoder 180, will be used to improve error correction capability of the system in a manner to be described.

It should be noted that the accuracy of the erasure flags generated by both the C1 and C2 decoders, 180 and 202 respectively, can be low. The accuracy of the flags is illustrated in FIG. 12 wherein either a C1 or C2 code word 208 is shown. The code word 208 is N symbols in length containing K information symbols and 2T (N-K) correction code symbols. Assuming that there are ten correction code symbols in each code word, the error correction code can correct up to five included errors (T=(N-K)/2).

The code word 208 typically contains anywhere from 50 to 255 symbols. Assume for purposes of this example that six of those symbols 210, as shown in FIG. 12, were transmitted with errors. Five errors alone can be corrected by the decoder. However, six error cannot be corrected. This will cause the whole code word, including all symbols that are correct, to be labeled in error and flagged. This illustrates the low accuracy of the erasure flags in that the probability that a code word erasure flag correctly indicates errors may be low because a majority, if not almost all symbols in a flagged word are correct. By flagging correct symbols in a code word as incorrect, the enhanced benefits of flagging erasures (i.e., increased correction capability) are diluted.

Referring again to FIG. 2, the following is an explanation of the manner with which the system of the present invention utilizes both the C1 and C2 erasure flags to accurately identify individual symbols containing an error rather than blocks of symbols (code words) containing an error. Symbol accurate flagging extends the range of correction because the decoder is not directed to correct flagged symbols that are not in error. To achieve this advantage, the C1 erasure flags output by the inner deinterleaver 190 indicating those columns containing errors are delayed through the action of delay element 212 and output on line 214. Delaying of the C1 erasure flags is necessary to adjust for the signal processing time required by the C2 decoder 202. As mentioned above, the C2 decoder 202 outputs C2 erasure flags on line 206. An AND gate 216 logically combines the C1 and C2 erasure flags for each symbol to generate a C1. C2 symbol accurate flag on line 218 that identifies individual symbols containing errors.

The processing of the C1 and C2 erasure flags to generate the C1·C2 symbol accurate flag can be best understood with reference to FIG. 2 and FIGS. 13A through 13F. FIG. 13A shows an array of symbols arranged in data plane format as output from the media channel decoder 170 on line 172. Within the data plane of FIGURE 13A are a plurality of individual symbols 220 (marked with an "x") in error and a string of contiguous symbols 222 in error. For purposes of this example, it will be assumed that the C1 decoder 180 corrected all the individual error symbols 220, but could not, because of the error correction limitations of the decoder, correct the string error of contiguous symbols 222.

The data plane of FIG. 13A is received by the C1 decoder 180 on a row by row basis, decoded, partially corrected and output, also on a row by row basis, to the inner deinterleaver 190 on line 182. The output of the C1 decoder for the complete data plane on line 182 (stripped of the C1 code symbols) is shown in data plane format in FIG. 13B and in time line format in FIG. 13C. The C1 erasure flags generated by the C1 decoder circuit and output on line 184 are active during the output of any row (C1 code group) containing a detected but uncorrectable error. The C1 erasure flag signal is shown in FIG. 13C under the C1 code group output signal as being active during the output of the uncorrectable string error of contiguous symbols 222. Even if a number of symbols within the string 222 are correct, the C1 erasure flag will still be active for each output row to signal the presence of symbol errors in that row.

The C1 code groups are then deinterleaved by the inner deinterleaver 190 and output on line 196. The C1 erasure flags are also passed through the deinterleaving process and output on line 200. In the inner deinterleaving process, the C1 code groups are input row by row and output column by column on line 196 producing an output time line signal for the data plane shown in FIG. 13D. As also shown in FIG. 13D, the deinterleaving process has distributed, in synchronism, the string error of contiguous symbols 222 and the active portions of the C1 erasure flag signal on line 200, such that C1 flags point to locations within the C2 code words containing symbol 222 errors.

The signal on line 196 is then processed by the C2 decoder 202, partially corrected and output as the C2 code group (minus the C2 code symbols) on line 204 as shown in FIG. 13E. The C2 decoder utilizes the C1 erasure flags on line 200 to correct each C2 code group containing less than 2T symbols of the string error in the contiguous symbols 222. Also output from the C2 decoder 202 on line 206 are the C2 erasure flags as shown under the C2 code group signal in FIG. 13E. The C2 erasure flags are active during the output of any C2 code group containing one or more uncorrected symbols in error, and therefore do not precisely identify the remaining portions of the string error 222 in the data symbols.

To generate the C1·C2 symbol accurate flag for precisely identifying individual symbols containing the remaining portions of the string error 222 or any other remaining error in the symbols, the C1 erasure flag on line 200 is delayed so as to be time synchronized with the C2 erasure flag output on line 206. The delayed C1 erasure flag is output from the delay circuit 212 on line 214 as shown in FIG. 13F. Also depicted in FIG. 13F is the C2 code group signal on line 204 containing the remaining uncorrected portions of the string error 222, and the C2 erasure flag output on line 206 identifying each code group in which a portion of the string error remains uncorrected. To identify the specific symbols containing the uncorrected error, the C2 erasure flag (line 206) and the delayed C1 erasure flag (line 214) are ANDed together to generate a C1·C2 symbol accurate flag signal on line 218 as shown in FIG. 13F.

Figure 14:
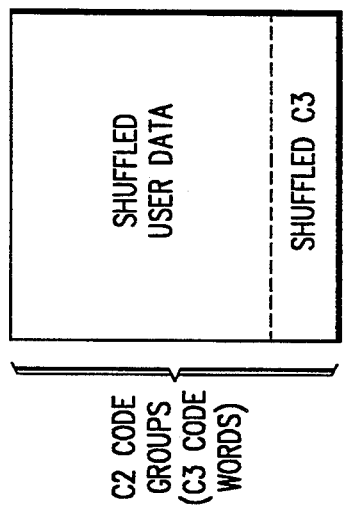
FIG. 14 is a depiction of a data plane as input into the outer deinterleaver.

The decoded C2 code groups (line 204) and the C1·C2 symbol accurate flags (line 218) are then input to an outer deinterleaver 230 in a data plane as illustrated in FIGURE 14. The outer deinterleaver 230 has a structure similar to that of the outer interleaver 16 as shown in FIG. 6 except that the memory arrays have increased storage capacity to store the C1·C2 symbol accurate flag as a ninth bit for each eight bit symbol. The C2 code groups input into the deinterleaver 230 are written sequentially on a column by column basis into the memory arrays of the deinterleaver in data plane format.

At this point, the C2 code groups (C3 code words) for the data planes stored in the memory arrays, which exist in a shuffled state, are unshuffled and output on line 232 through the generation of the correct sequence of addresses by the read address counter and look-up table. By use of the look-up table the sequentially generated read counter addresses are converted to a predetermined nonsequential series of addresses for accessing and outputting the C3 code words in the same order as received by the outer interleaver 16. Also output from the deinterleaver 230 are the C1·C2 symbol accurate flags on line 234 identifying individual symbols still containing errors.

The deinterleaved C3 code words output on line 232 and the C1·C2 symbol accurate flags output on line 234 from the outer deinterleaver 230 are next processed by the C3 decoder 240 which detects and corrects as many included symbol errors as possible. The C3 code symbols are then stripped from the code words leaving only the original user data (C3 code groups), substantially error free, for output on line 242. With the presence of the C1·C2 symbol accurate flags and the C3 code symbols, the range of correction for the C3 decoder 240 is enhanced from T to 2T errors.

Those skilled in the art will appreciate that many modifications may be made on the above described system and its component parts without departing from the spirit and scope of the invention. For example, the run-length limiting encoder and decoder for the media channel encoder and decoder may be replaced or eliminated from the system. In an alternate embodiment of the invention without a media channel encoder or decoder, as shown in FIG. 15, the system of the present invention performs in a similar manner except that the C1 decoder is limited to correction of T errors because of the lack of input sequence violation flags. In FIG. 15, the same reference numbers are used to identify the same or similar components of FIG. 2.

Furthermore, the contents of the look-up table used in the outer interleaver and deinterleaver, 16 and 230 respectively, or the number of columns (m) and rows (n), can be modified to alter the nature of the orthogonal interleave. Thus, some other orthogonal interleave other than row shuffling may be implemented, for example, column shuffling.

In other alternate embodiments, multiple memory arrays for the outer interleaver and deinterleaver are replaced with a single memory and all interleaving and deinterleaving steps are performed in a single large memory array. Furthermore, a properly programmed central processor can replace the system components and perform three-way orthogonal interleaving and encoding. Alternatively, multiple processing units can be configured to separately operate the system components and handle interprocessor data communications.

The method and apparatus of the triple orthogonal interleaved error correction system of the present invention is applicable to any data transmission, storage, reception and play back media even though the system has been described above with respect to its preferred embodiment for use with a high density helical scan digital tape recorder. The use of orthogonal row shuffling provides protection against signal degradation caused by tape manufacturing defects, roller imprints, scratches, data track loss, noise introduction, transient or recurrent conditions in the media channel and other known causes of error.

The encoding of the C3 and C2 code words in the same column but across orthogonally shuffled rows provides protection against long and intermediate length errors. In addition, feeding the media channel detected sequence violation errors to the C1 decoder doubles the potential error correction range of the C1 decoder. This enhances operation of the system as the use of the sequence violation flags in conjunction with the C1·C2 symbol accurate flags yields increased random error protection while devoting a minimum proportion of the data space to error detection and correction symbols. In another embodiment of the present invention, shown in FIG. 16 as an addition to the system shown in FIG. 2 the sequence violation (S.V.) flags and C1 decoder flags are logically combined to output a C1·S.V. symbol accurate error flag for input into the inner deinterleaver 190 and C2 decoder 202.

As shown in FIG. 16, the S.V. flags are output to the inner decoder 180 from the media channel decoder 170 on line 174. The S.V. flags are also input to and delayed by a delay element 181 for output on line 183. Delaying of the S.V. flags is necessary to adjust for the signal processing time required by the C1 decoder 180. As previously described, the C1 decoder 180 outputs C1 erasure flags on line 184. An AND gate 185 logically combines the S.V. and C1 flags to generate the C1·S.V. error flag on line 184' for input to the inner deinterleaver 190 and further processing by the C2 decoder. Use of media channel sequence violation flags, the C1·S.V. error flags and C1·C2 symbol accurate flags as described above provides maximum random error protection in proportion to the amount of data space dedicated to code symbols.

In a further embodiment of the present invention, an additional circuit for enabling the detection and rewriting of errors included in transmitted or recorded data is provided. The block diagram for the rewrite system is also shown in FIG. 16 as an addition to the system shown in FIG. 2. The error correction codes for the rewrite system are structured such that a decision is made immediately upon writing data to determine if the number of included errors is so great that a rewriting of that data is necessary (read-while-write). The transmit/record and the receive/playback portions of the read-while-write system are essentially the same in structure to the system shown in FIG. 2.

The playback portion is configured to read the data immediately after it is written into the media channel (for example to a helical scan digital tape recorder). The written encoded data is then processed by the C1 and C2 decoders, 180 and 202 respectively, where the number of detected included errors in each data plane are counted and output on lines 184 and 206, respectively.

Two sums are calculated from the number of C1 and C2 erasure flags output from the C1 and C2 decoders, 180 and 202, respectively. The first is a sum of the number of C1 erasure flags per data plane, and the second is a sum of the number of C2 erasure flags per data plane. Thus, the rewrite system determines the number of data errors contained in a portion of the data stream read from the media channel. The first sum (C1) is compared to a threshold value set to represent the maximum tolerable random error and the second sum (C2) is compared to a threshold value set to represent the maximum tolerable burst error. If either threshold value is exceeded, the process to rewrite the data plane or track affected by the threshold exceeding number of detected errors is triggered. The C2 check protects against the possibility that one or more symbols decoded by the C2 decoder continue to contain uncorrected errors. The threshold levels for the C1 and C2 sums are selectable by the system user, thereby enabling the user to tailor the system according to the desired tradeoff between write accuracy and the frequency of rewrites.

Referring to the read-while-write circuit of FIG. 16, an accumulator 250 counts the number of C1 erasure flags per data plane and outputs the count to a comparator 252. Another accumulator 254 counts the number of C2 erasure flags per data plane, also outputting the count to the comparator 252. The comparator 252 has two threshold inputs, received on lines 256 and 258, for setting the number of tolerable C1 and C2 errors per data plane or track. When either threshold level is exceeded for a given data plane, the comparator 252 outputs a rewrite signal on line 260.

The rewrite signal on line 260 is coupled to the data source (not shown) to direct the source to stop the flow of new data from the data source to the C3 encoder 12. The signal is also coupled to a disabling AND gate 262 to stop the flow of new incoming data into the system. The rewrite signal on line 260 is further coupled to the arbitration logic circuit 84 (FIG. 6) of the outer interleaver 16. This causes the arbitration logic circuit 84 to preset the read address counter 76 and look-up table 78 at the starting address of the memory arrays 60 for the data plane that is to be rewritten. The portion of data in error is then reread and output on line 82 to be re-interleaved and re-encoded by the write portion of the system for transmission over the media channel. The memory arrays 60 of the outer interleaver 16 must be of sufficient size to store data for the period of time required for testing by the rewrite circuit.

As mentioned above, the embodiments of the invention as shown in FIGS. 2 and 16 utilize a media channel encoder 160 that implements a run-length limiting encoding scheme commonly referred to as Miller-Squared ($M^2$) encoding. It will of course be understood that other media channel encoding schemes, or no media channel encoding scheme as in FIG. 15, may be used in practicing the invention. The code, encoder and decoder for implementing a conventional $M^2$ run-length limiting coding scheme are described in U.S. Re. No. 31,311 issued to Miller, the disclosure of which is hereby fully incorporated by reference.

As is well known, the waveforms of transmitted digital data are divided into bit cells with each cell containing one bit of data in binary form. Data transitions (from logic 1 to 0 or vice versa) need not occur at the beginning or end of a bit cell. The sequencing rules as taught by Miller provide that logic 0 bits are identified by transitions at the beginning of the cell and logic 1 transitions are identified by data transitions at midcell. The one exception to this rule is that transitions are suppressed if they occur within one bit cell of a prior transition. An additional sequencing rule for $M^2$ coding is applied such that the last transition from any even number of logic 1's followed by a logic 0 is suppressed.

Because the transitions in $M^2$ coded data occur at two locations in the data cell, the clock cycle needed for decoding the data operates at twice the frequency of the serial data rate of the unencoded data. Thus, there are two $M^2$ clock cycles for each data cell. The principles of conventional $M^2$ encoding and decoding are more fully explained in U.S. Pat. Re. No. 31,311. Errors in $M^2$ encoded data occur when the specially encoded transition locations in the data cell according to the sequencing rules are shifted by transient or recurrent conditions in the media channel thus confusing whether the transition signifies a logic 1 or 0.

The conventional run-length limiting decoder, as disclosed in the Miller Patent merely decodes the data stream. The decoder provides no error detection or correction capability and operates independently from any other included error detection and correction circuits. Thus, the decoder does not identify instances where the media channel has introduced errors that violate the $M^2$ sequencing rules. It would however be advantageous if such sequencing violations could be flagged. With flagging of the $M^2$ errors, improved performance of the error correcting decoders, for example from T to 2T, is possible as flagged errors require only one code symbol for correction.

There are three constraints or conditions (sequencing violations) in the $M^2$ coded data stream that are easily checked on the decode side to detect illegal $M^2$ code sequences. First, if the run length between transitions in the $M^2$ code stream is shorter than the minimum of one data cell (two $M^2$ clocks), then a short run sequence violation has occurred. Second, if the run length between transitions in the $M^2$ code stream is longer than the maximum of three data cells (six $M^2$ clocks), then a long run violation has occurred. The third constraint examines every run length exceeding two data cells (four $M^2$ clocks). If the transition beginning the run occurred in the middle of a data cell then the sequence is a correct $M^2$ sync sequence, and is used by the decoder to determine the location of cell boundaries. However, if the transition beginning the run occurred at the boundary between two adjacent data cells, then a sync sequence error is detected.

It is important in an error detecting $M^2$ decoder that the data flagged by the decoder as in error in fact contain an error. Otherwise, one error correction code check symbol devoted to correction by subsequent decoders will be wasted correcting data not in error and unavailable to correct other included errors. Thus, there are two criteria in developing a run-length limiting, error flagging decoder. First, the decoder should detect as many media channel introduced errors as possible. Second, the decoder should minimize the amount of correctly decoded data flagged as in error. In balancing these two criteria, the decoder should only flag questionable data as being in error, leaving all other errors for later detection and correction by subsequent error correction decoders.

Referring now to FIG. 17A, there is shown a conventional $M^2$ decoder with included circuitry to detect and flag short run violation errors. For purposes of clarity, the clock synchronization circuitry is not shown and the added short run violation detection circuitry is shown enclosed by broken lines. The clock synchronization circuitry is shown in FIG. 17B. The AND gates G6–G9 receive the outputs of shift register flip flops SR1–SR5, with the AND gate outputs ORed together by gate G10 for output to flip flop FF6.

Figure 18:
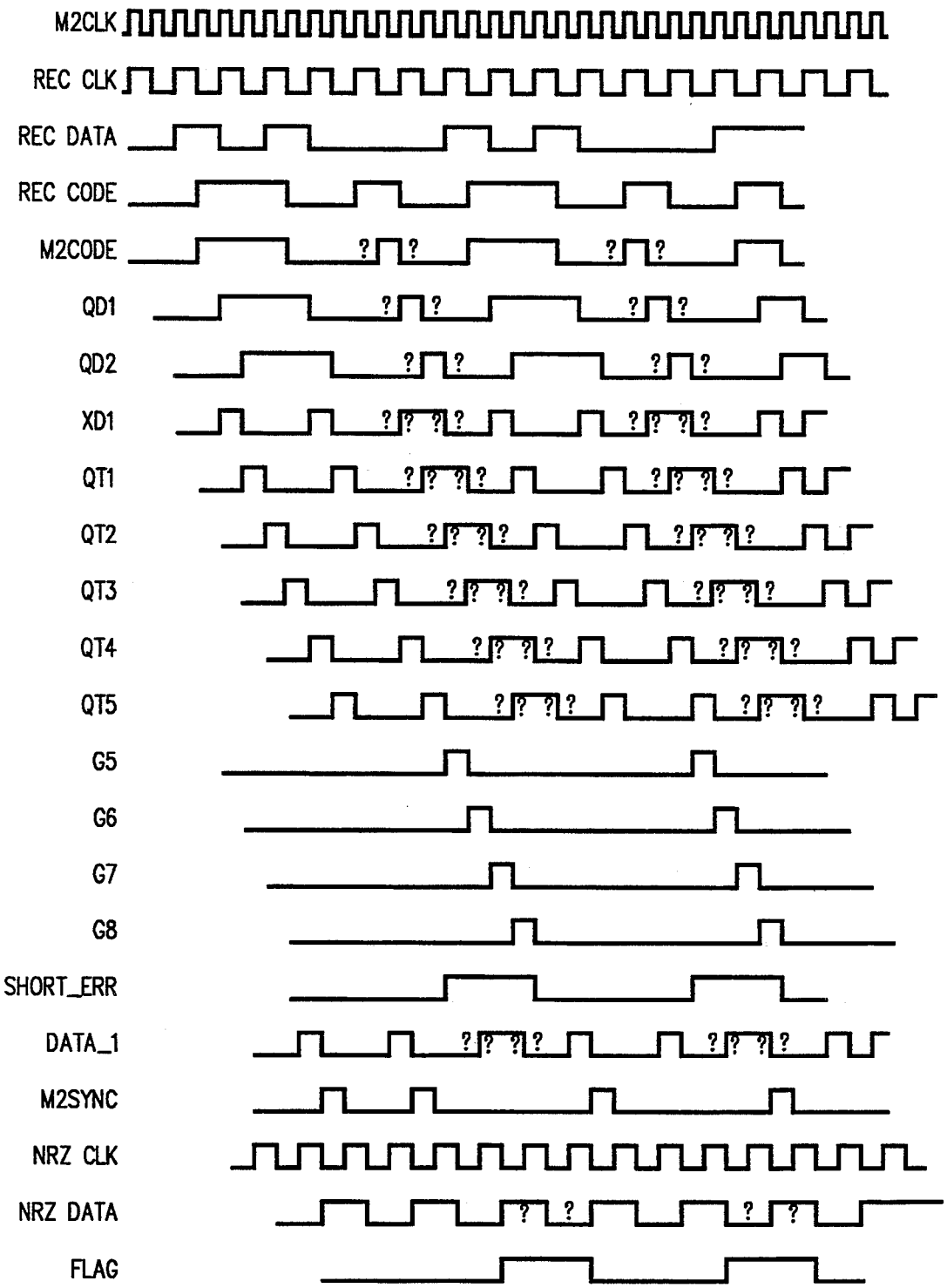
FIG. 18 is a timing diagram for the circuit of FIG. 17A.

FIG. 18 shows a timing diagram illustrating the operation of the circuit of FIG. 17A for detecting and flagging short run errors. The record data and record $M^2$ code sequence (output from the $M^2$ encoder) are shown along with the record and $M^2$ clock signals. Next is shown the $M^2$ code as received by the decoder circuit of FIG. 17A containing a pair of code transitions separated by only one $M^2$ clock indicating a short run sequence violation. The two locations for each error where the transition has been shifted in error are marked with question marks (?) as the decoder does not know which was shifted and which was not.

In the five bit shift register SR1–SR5, there are two consecutive taps which are high and four possible error locations marked with question marks (?) for each sequence violation due to the operation of XOR gate G1. The outputs from AND gates G6–G9 will be high on the $M^2$ clock following times when their associated inputs from shift register flip flops SR1–SR5 are both high. The short run error output from OR gate G10 will be high whenever the output of gate G6–G9 are high. Thus, the short run error flag (output from flip flop FF6) will be signalled for the two data cells (four $M^2$ clocks) where the short run error has been detected. This error flag is passed on to a subsequent error correction decoder to provide enhanced error correction capability.

Figure 19:
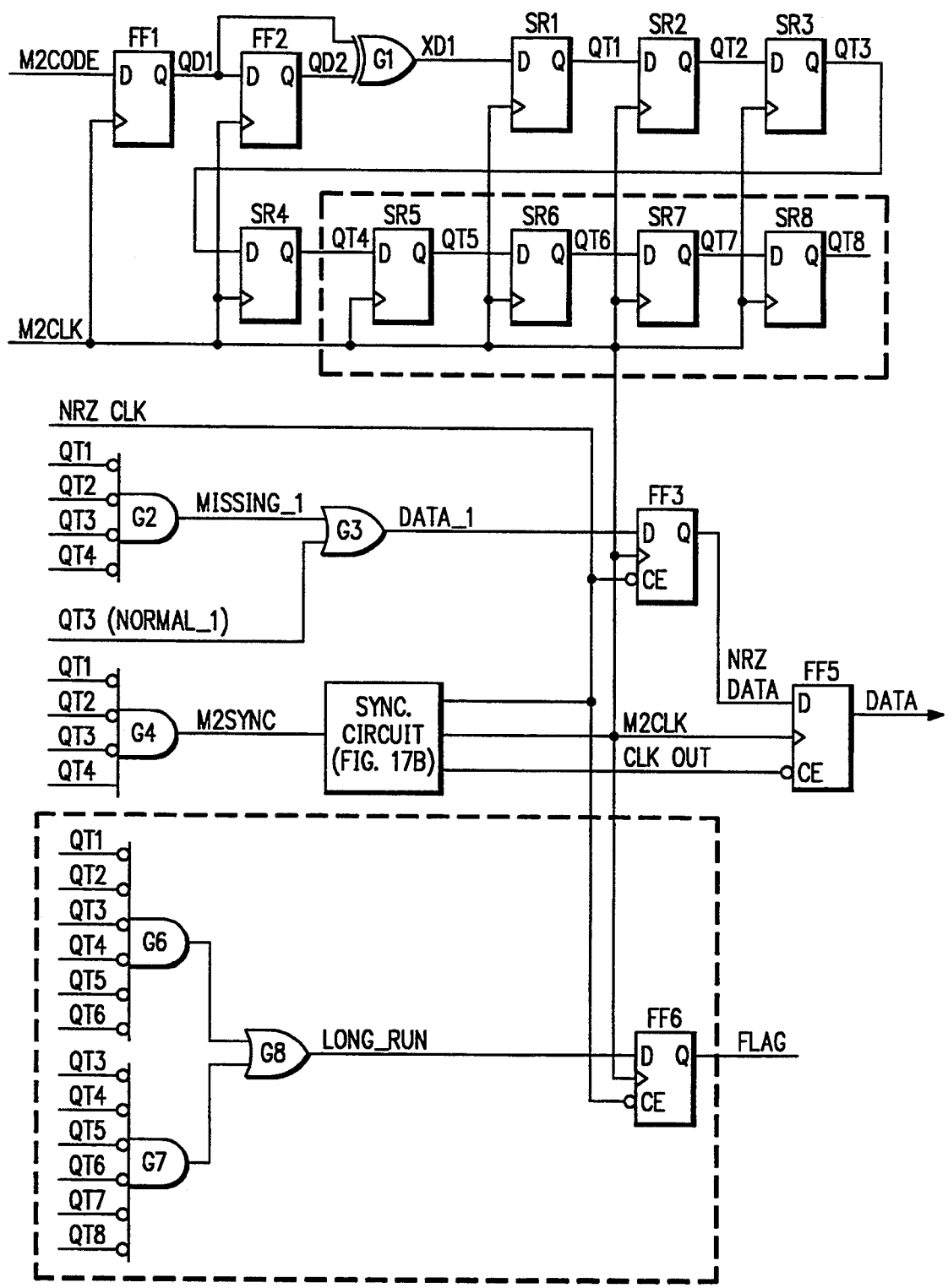
FIG. 19 is a block diagram of a $M^2$ decoder in accordance with the present invention including circuitry for detecting and flagging long run errors.

Referring now to FIG. 19, there is shown a conventional $M^2$ decoder with included circuitry to detect and flag long run violation errors. For purposes of clarity, the clock synchronization circuit is not shown and the added long run violation detection circuitry is shown enclosed by broken lines. Again, the clock synchronization circuit is shown in FIG. 17B. AND gate G6 receives the outputs of shift register flip flops SR1–SR6, and AND gate G7 receives the outputs of shift register flip flops SR3–SR8. The outputs of AND gates G6 and G7 are ORed together by gate G8 for output to flip flop FF6.

Figure 20:
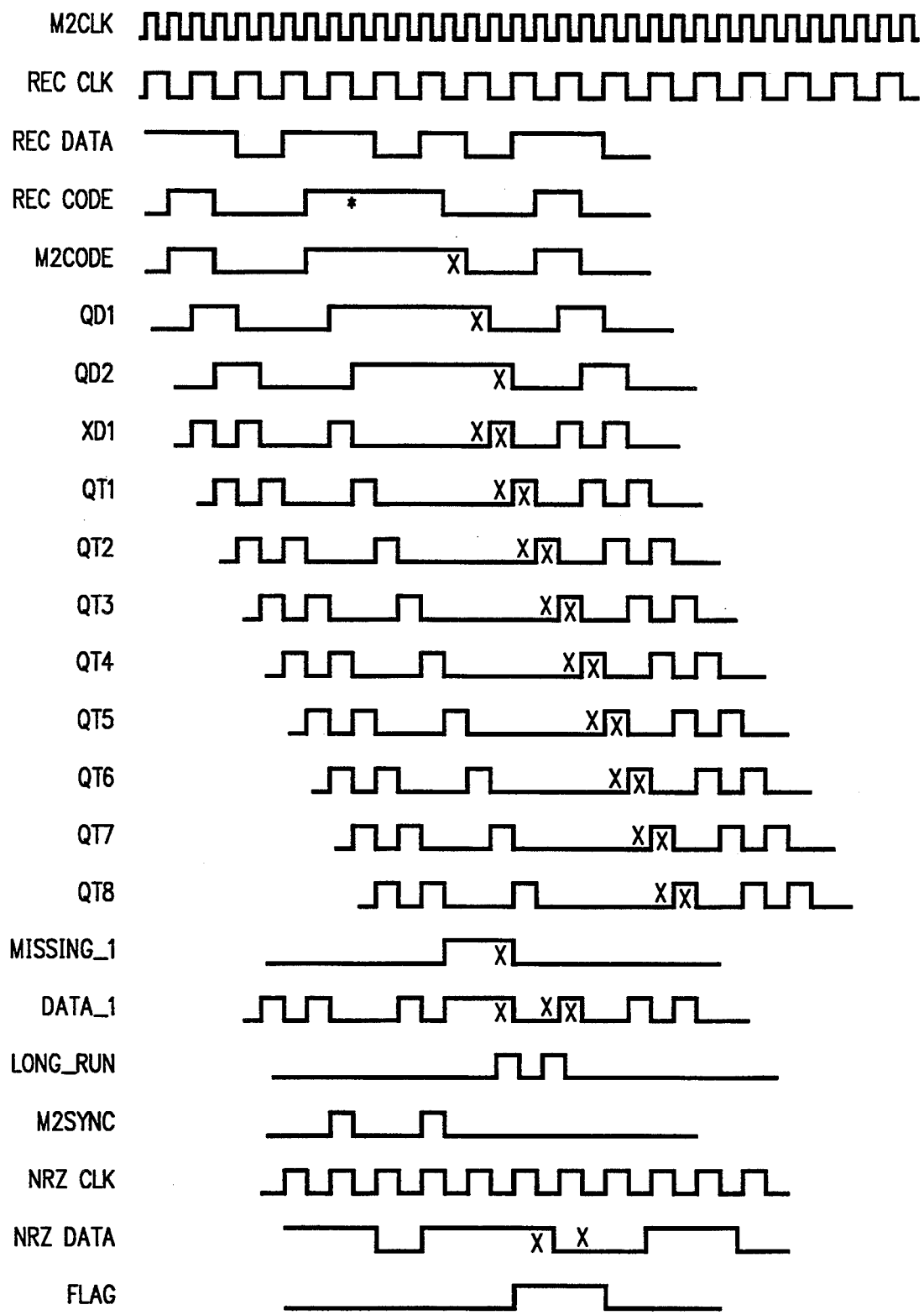
FIG. 20 is a timing diagram for the circuit of FIG. 19.

FIG. 20 shows a timing diagram illustrating the operation of the circuit of FIG. 19 for detecting and flagging long run errors. The record data and record $M^2$ code sequence (output from the $M^2$ encoder) are shown along with the record and $M^2$ clock signals. Next is shown the $M^2$ code as received by the decoder circuit of FIG. 19 containing a pair of code transitions separated by three and a half data cells (seven $M^2$ clocks) indicating a long run violation. The location of the incorrect transition, at the end of the block, is marked with an "x" while location of the cause of the error, a missing 1 transition in the middle of the seven clock sequence, is marked with an asterisk (*). The decoder knows the ending transition, rather than the beginning transition, was shifted because the beginning transition correctly occurs in the middle of a data cell.

In the shift register flip flops SR1–SR8, there are two possible error locations (x), or incorrectly decoded data bits due to the operation of XOR gate G1. One corresponds to an incorrect bit at the output of shift register flip flop SR3. The other occurs because the output of gate G2 is incorrectly high indicating an incorrect zero bit at the output of shift register flip flop SR1. The output of AND gate G6 is high when the outputs of shift register flip flops SR1–SR6 are low. The output of AND gate G6 will be low two $M^2$ clocks later as it receives inputs from the outputs of shift register flip flops SR3–SR8. OR gate G7 will be high when either of the outputs of AND gates G6 and G7 are high. Due to the timing relationship between the output of OR gate G8 and the NRZ CLK at FF6, an error flag indicating an error at the end of a long run (x) is output if the OR gate G8 output is high and NRZ CLK is low.

Figure 21:
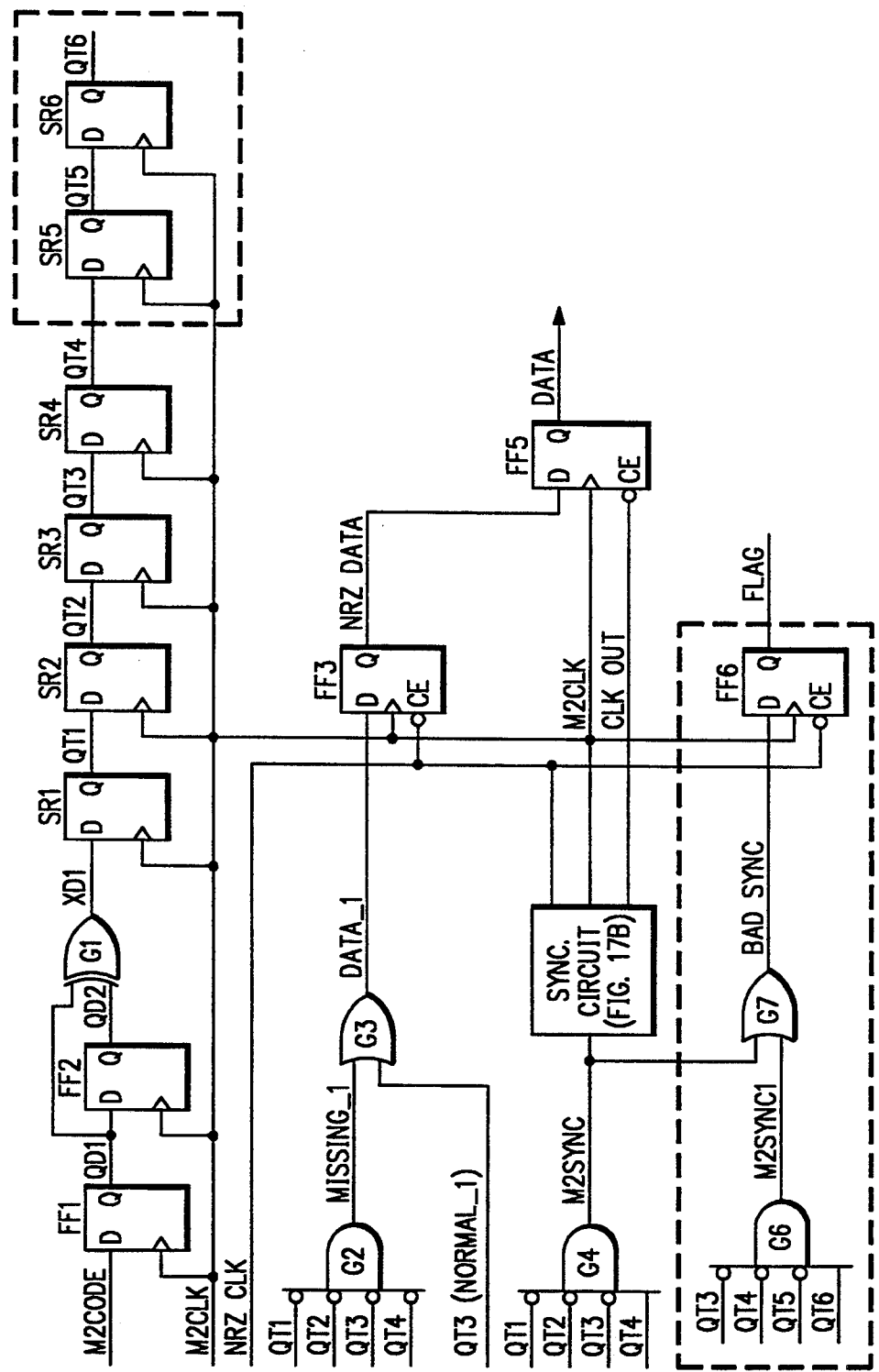
FIG. 21 is a block diagram for a $M^2$ decoder in accordance with the present invention including circuitry for detecting and flagging sync sequence errors.

Referring now to FIG. 21, there is shown a conventional $M^2$ decoder with included circuitry to detect and flag illegal $M^2$ sync sequence errors. For purposes of clarity, the clock synchronization circuit is not shown and the added illegal sync sequence detection circuitry is shown enclosed by broken lines. Again, the clock synchronization circuit is shown in FIG. 17B. AND gate G6 receives the outputs of shift register flip flops SR3–SR6. The output of the AND gate G6 is ORed with the output of AND gate G4 by gate G7 having an output applied to flip flop FF6.

Figure 22:
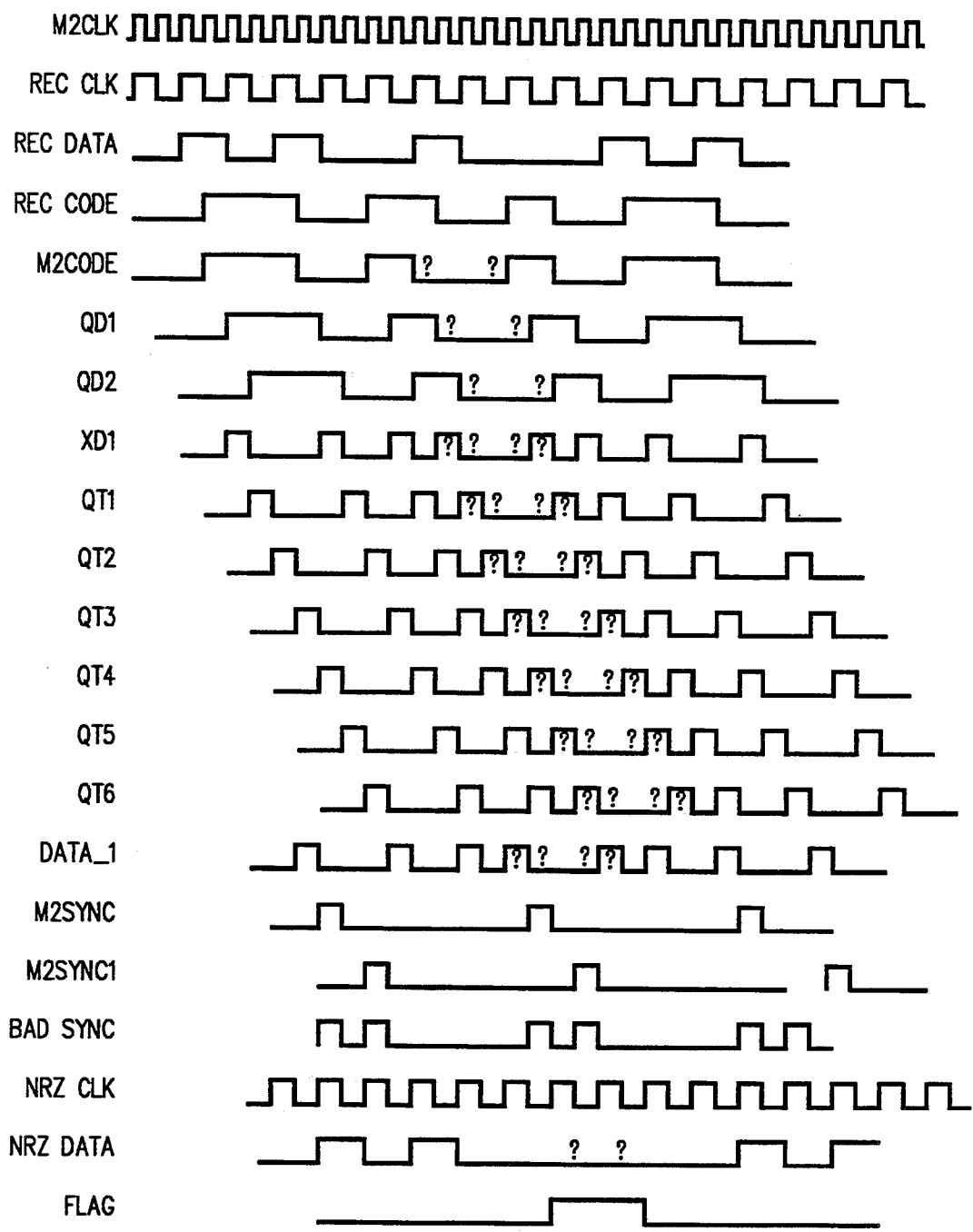
FIG. 22 is a timing diagram for the circuit of FIG. 21.

FIG. 22 shows a timing diagram illustrating the operation of the circuit of FIG. 21 for detecting and flagging illegal $M^2$ sync sequence errors. The record data and record $M^2$ code sequence (output from the encoder) are shown along with the record and $M^2$ clock signals. Next is shown the $M^2$ code as received by the decoder circuit of FIG. 21 containing a pair of code transitions separated by two data cells (four $M^2$ clocks) with the initial transition falling on the boundary between two data cells indicating a sync sequence violation. The two locations for each error where the transition has been shifted in error are marked with question marks (?) as the decoder does not know which was shifted and which was not.

In the shift register flip flops SR1–SR6, there are four possible error locations identified by question marks (?) due to the operation of XOR gate G1. The output of AND gate G4 will be high when the outputs from SR1–SR3 are low and the output from SR4 is high. The output of AND gate G6 will be high two $M^2$ clocks later as it receives inputs from the outputs of shift register flip flops SR3–SR6. The output of OR gate G7 will be high when either output from gates G4 or G6 is high. Due to the timing relationship between the output of gate G7 and the NRZ CLK at FF6, an error flag indicating an error at the beginning of the run (? sync error) will be generated if the OR gate G7 output is high and NRZ CLK is low.

With the error detection circuitry of FIGS. 17A, 19 and 21 added to the conventional $M^2$ decoder circuit and utilized in the system of FIGS. 2 and 16, shifted transitions in the encoded bit stream are detected and flagged as sequence violations (S.V.) for subsequent processing and correction by the C1 error correction decoder. It will of course be understood that each flagging circuit need not be incorporated into the system. The exact position of the error in the flagged location will be uncertain because the error flagging circuits flag two bits rather than just one. Otherwise, error correction would be easy as a single flagged error bit could just be inverted.

Although several embodiments for the triple orthogonally interleaved error correction system and its component parts have been discussed in the foregoing Detailed Description and illustrated in the accompanying Drawings, it will be understood that the invention is not limited to the embodiments disclosed, but is capable of numerous rearrangements, modifications and substitutions without departing from the spirit of the invention as set forth and defined by the following claims.

We claim:

1. A method for interleaving and encoding a user data stream, comprising the steps of:
    dividing the user data stream into a sequence of first code groups;
    encoding each first code group in the sequence by appending thereto a first error correction code to form a first code word;
    sequentially combining each encoded first code word according to the sequence of first code groups to output a sequence of first code words;
    arranging the sequence of first code words into a first series of two-dimensional column by row data planes;
    orthogonally interleaving the first series of data planes by inter-data plane row shuffling to form a second series of two-dimensional column by row data planes, each column of the second series of data planes comprising a second code group for sequential output;
    encoding each second code group in the sequence by appending thereto a second error correction code to form a second code word;
    sequentially combining each encoded second code word according to the sequence of second code groups to output a sequence of second code words;
    arranging the sequence of second code words into a second code word two-dimensional column by row data plane, each row of the data plane comprising a third code group;
    interleaving the arranged second code words in the second code word data plane by sequentially outputting the rows of the first data plane as a sequence of third code groups;
    encoding each third code group in the sequence by appending thereto a third error correction code to form a third code word; and
    sequentially combining each encoded third code word according to the sequence of third code groups to output a sequence of third code words as the interleaved and encoded user data stream.

2. The method as in claim 1 further comprising the step of encoding the sequence of third code words with a run-length limiting code.

3. The method as in claim 1 wherein the step of arranging the sequence of first code words comprises the step of sequentially storing an integral number of first code words in each column of the first series of data planes.

4. The method as in claim 3 wherein one first code word is stored in each column of the first series of data planes.

5. The method as in claim 1 wherein the step of arranging the sequence of second code words comprises the step of sequentially storing an integral number of second code words in each column of the second code word data plane.

6. The method as in claim 5 wherein one second code word is stored in each column of the second code word data plane.

7. The method as in claim 1 wherein the step of orthogonally interleaving by inter-data plane row shuffling comprises the step of shuffling the rows of the first series of data planes between data planes according to a predetermined shuffling algorithm to form the second series of a data planes while maintaining relative row position of a shuffled row between the first and second series of data planes.

8. The method as in claim 1 wherein:
    the step of arranging the sequence of first code words comprises the step of sequentially storing one first code word per data plane column; and
    the step of arranging the sequence of second code words comprises the step of sequentially storing one second code word per data plane column;
    further comprising the step of arranging the sequence of third code words into a third code word two dimensional column by row data plane, one third code word sequentially stored per data plane row, such that the third error correction code is transverse to the first and second error correction codes.

9. The method as in claim 1 wherein the first and second series of data planes and the second code word data plane each comprise a pair of data storage buffers alternately available for reading and writing such that while a first buffer receives a portion of a sequence of uninterleaved code words for storage, a second buffer is outputting, in interleaved fashion, a preceding portion of a sequence as previously stored.

10. The method as in claim 1 further comprising decoding and deinterleaving the interleaved and encoded user data stream output as a sequence of third code words, the interleaved and encoded user data stream received as a sequence of fourth code words comprising the sequence of third code words with a total number of included data errors introduced therein, comprising the steps of:

decoding each fourth code word in the received sequence of fourth code words by detecting included data errors and correcting a first set number of data errors according to the appended third error correction code, each decoded fourth code word minus the third error correction code comprising a fourth code group combined according to the sequence of fourth code words for output as a sequence of fourth code groups substantially equal to the sequence of third code groups and including first erasure flags indicating each fourth code group in the sequence containing a detected but uncorrected error;

arranging the sequence of fourth code groups and first erasure flags into a fourth code group two-dimensional column by row data plane, each column comprising a fifth code word;

deinterleaving the sequence of fourth code groups and first erasure flags in the fourth code group data plane by sequentially outputting the columns of the data plane as a sequence of fifth code words and including deinterleaved first erasure flags;

decoding each fifth code word by detecting included data errors and correcting a second set number of data errors according to the appended second error correction code and the deinterleaved first erasure flags, each decoded fifth code minus the second error correction code comprising a fifth code group combined according to the sequence of fifth code words for output as a sequence of fifth code groups substantially equal to the sequence of second code groups including second erasure flags indicating each fifth code group in the sequence containing a detected but uncorrected error;

combining the first and second erasure flags to generate a third erasure flag pointing to locations within each fifth code group having data in error;

arranging the sequence of fifth code groups with the third erasure flags into a third series of two-dimensional column by row data planes;

orthogonally deinterleaving the third series of data planes by inter-data plane row unshuffling to form a fourth series of two-dimensional column by row data planes, each column of the fourth series of data planes comprising a sixth code word for sequential output and including deinterleaved third erasure flags;

decoding in sequence each sixth code word by detecting included data errors and correcting a third set number of data errors according to the appended first error correction code and the third erasure flags, each decoded sixth code word minus the first error correction code combined according to the sequence of sixth code words for output as a sequence of sixth code groups, wherein the sequence of sixth code groups are substantially equal to the sequence of first code groups comprising the user data stream.

11. The method as in claim 10 further comprising the steps of:

encoding the output sequence of third code words with a run-length limiting code; and decoding the run-length limiting encoded sequence of third code words to generate the sequence of fourth code words that include data errors.

12. The method as in claim 11 further comprising the steps of:

detecting run-length errors in the sequence of run-length limiting decoded fourth code words; and outputting the sequence of fourth code words including run-length erasure flags indicating detected run-length errors.

13. The method as in claim 12 wherein the step of decoding each fourth code word further includes the step of using the run-length erasure flags to enhance correction capability such that the sum of first, second and third set number of corrected errors substantially equals the total number of included data errors introduced into the sequence of third code words.

14. The method as in claim 12 further comprising the step of combining the run-length erasure flag and first erasure flag to generate a fourth erasure flag to assist in decoding each fifth code word, comprising the steps of:

delaying the run-length erasure flag to adjust for the processing needed to perform the step of decoding each fourth code word; and logically combining the delayed run-length erasure flag in synchronization with the first erasure flag.

15. The method as in claim 10 wherein the steps of orthogonally interleaving and deinterleaving by inter-data plane shuffling and unshuffling are opposite row shuffling operations such that each shuffled row in the third series of data planes is unshuffled and returned to a position in the fourth series of data planes corresponding to that position the row occupied in the first series of data planes.

16. The method as in claim 10 wherein the step of combining the first erasure flag and second erasure flag includes the steps of:

delaying the first erasure flag to adjust for an amount of processing time needed to perform the step of decoding fifth code words; and logically combining in synchronization the delayed first erasure flag and the second erasure flag to generate the third erasure flag pointing to locations within each fifth code group having data in error.

17. The method as in claim 10 wherein the sequence of third code words are written into a media channel, further comprising the step of reading the media channel while writing thereto, comprising the steps of:

reading the sequence of third code words from the media channel after transmission thereto to provide the sequence of fourth code words which include a total number of channel introduced data errors;

dividing the sequence of fourth code words into predetermined portions;

counting the number of first erasure flags generated for each predetermined portion;

comparing the number of first erasure flags for each portion to a first threshold number; and triggering a rewrite into the media channel of the user data stream corresponding to the portion of the sequence of fourth code words affected by errors exceeding the first threshold.

18. The method as in claim 17 wherein the step of triggering further comprises the steps of:

inhibiting further transmission of the user data stream; and accessing a portion of the user data stream transmitted to the media channel corresponding to the portion of the sequence of fourth code words containing excessive errors for re-encoding, re-interleaving and writing into the media channel.

19. The method as in claim 17 further comprising the steps of:
counting the number of second erasure flags generated for each predetermined portion indicating the number of channel introduced errors in each portion of the user data;
comparing the number of second erasure flags to a second threshold number; and
triggering a rewrite into the media channel of the user data stream corresponding to the portion of the sequence of fourth code words affected by errors exceeding the second threshold.

20. Apparatus for interleaving and encoding a data stream divided into a sequence of first code groups, comprising:
first encoding means for calculating and appending a first error correction code to each first code group to form a first code word, each first code word combined according to the sequence of first code groups for output as a sequence of first code words;
means for orthogonally interleaving the sequence of first code words including means for sequentially storing the sequence of first code words into a first series of two-dimensional column by row data planes on a column by column basis, the first code words orthogonally interleaved by inter-data plane row shuffling according to a predetermined shuffling sequence to form a second series of two-dimensional column by row data planes, each column of the second series of data planes comprising a second code group for sequential output as a sequence of second code groups;
second encoding means for calculating and appending a second error correction code to each second code group to form a second code word, each second code word combined for output according to the sequence of second code groups as a sequence of second code words;
means for interleaving the sequence of second code words including means for sequentially storing the sequence of second code words into a second code word two dimensional column by row data plane on a row by row basis, each row comprising a third code group, the second code words interleaved by sequentially outputting rows of third code groups as a sequence of third code groups; and
third encoding means for calculating and appending a third error correction code to each third code group to form a third code word, each third code word combined to output a sequence of third code words representing the interleaved and encoded data stream.

21. The apparatus as in claim 20 further comprising means for encoding the sequence of third code words with a run-length limiting code.

22. The apparatus as in claim 21 wherein the means for encoding comprises a Miller-squared encoder.

23. The apparatus as in claim 20 wherein each of the first, second and third encoding means comprises a Reed-Solomon encoder.

24. The apparatus as in claim 20 wherein the means for storing of said means for orthogonally interleaving comprises first and second data storage buffers alternately available for reading and writing such that while the first buffer receives for storage a predetermined part of the sequence of first code words as a first series of data planes, the second buffer outputs a preceding part of the sequence of first code words as previously stored and having been orthogonally interleaved to form the second series of data planes.

25. The apparatus as in claim 24 wherein each data storage buffer comprises a plurality of two dimensional random access memories each holding at least one data plane.

26. The apparatus as in claim 20 wherein the row shuffling sequence maintains relative row location as the rows are shuffled between the series of data planes.

27. The apparatus as in claim 20 wherein the means for storing of said means for interleaving comprises first and second two-dimensional column by row data storage buffers alternately available for reading and writing such that while a predetermined part of the sequence of second code words are written into the columns of the first buffer, each row of the second buffer will be sequentially read to output a preceding part of the sequence of second code words previously stored in the columns of the first buffer.

28. The apparatus as in claim 20 wherein the sequence of third code words are written into a media channel, the media channel introducing data errors therein, further including a decoder and deinterleaver receiving from the media channel a sequence of fourth code words comprising the third sequence of code words with a total number of included data errors introduced therein, comprising:
first decoding means for detecting data errors and correcting a first number of included data errors in the sequence of fourth code words according to the third error correction code, the decoded fourth code words minus the third error correction code being output according to the sequence of fourth code words as a sequence of fourth code groups that include first erasure flags indicating fourth code groups containing detected but uncorrected data errors;
means for deinterleaving the sequence of fourth code groups and first erasure flags including means for sequentially storing the sequence of fourth code groups and first erasure flags into a fourth code group two-dimensional column by row data plane on a row by row basis, each column comprising a fifth code word, the sequence of fourth code groups deinterleaved by sequentially outputting the columns of the data plane as a sequence of fifth code words, including deinterleaved first erasure flags;
second decoding means for detecting data errors and correcting a second number of included data errors in the sequence of fifth code words according to the second error correction code and the first erasure flags, the decoded fifth code words minus the second error correction code output according to the sequence of fifth code words as a sequence of fifth code groups including second erasure flags indicating fifth code groups containing detected but uncorrected data errors;
means for combining the first and second erasure flags to generate a third erasure flag identifying locations within each fifth code group having uncorrected data errors;
means for orthogonally deinterleaving the sequence of fifth code groups including means for sequentially storing the sequence of fifth code groups and third erasure flags into a third series of two-dimensional column by row data planes on a column by column basis, the sequence of fifth code groups orthogonally deinterleaved by inter-data plane row unshuffling to form a fourth series of data planes corresponding to the first series of data planes, each column of the fourth series of data planes comprising a sixth code word, the columns of the fourth series of data planes sequentially output as a sequence of sixth code words, including deinterleaved third erasure flags;

third decoding means for detecting data errors and correcting a third number of included data errors in the sequence of sixth code words according to the first error correction code and the third erasure flags, the decoded fifth code words minus the first error correction codes output according to the sequence of sixth code words as a sequence of sixth code groups, wherein the sequence of sixth code groups are substantially equal to the sequence of first code groups comprising the data stream.

29. The apparatus as in claim 28 further comprising:
means for encoding the sequence of third code words with a run-length limiting code; and
means for decoding the run-length limiting encoded sequence of third code words to generate the sequence of fourth code words.

30. The apparatus as in claim 29 wherein the means for run-length limiting decoding further comprises means for detecting run-length errors in the sequence of fourth code words and outputting run-length erasure flags identifying included errors in the sequence of fourth code words.

31. The apparatus as in claim 30 further comprising means for combining the run-length erasure flag in synchronization with the first erasure flag comprising:
means for delaying the run-length erasure flag to adjust for the processing time of the first decoding means; and
means for logically combining the delayed run-length erasure flag and first erasure flag to generate a fourth erasure flag for processing by said second decoding means to identify error locations within the sequence of fourth code groups.

32. The apparatus as in claim 30 wherein the first decoding means uses the run-length erasure flags in addition to the third error correction codes to detect and correct additional errors in the sequence of fourth code words thereby enhancing error correction capability such that the sum of the first, second and third corrected errors substantially equals the total number of introduced data errors.

33. The apparatus as in claim 30 wherein the run-length limiting code comprises a Miller-squared code, and the means for encoding and decoding comprises a Miller-squared encoder and decoder, and wherein the means for detecting includes:
means for detecting and flagging short run data sequence violations in the sequence of channel decoded fourth code words;
means for detecting and flagging long run data sequence violations in the sequence of channel decoded fourth code words; and
means for detecting and flagging illegal Miller-squared sync sequences in the sequence of channel decoded fourth code words.

34. The apparatus as in claim 28 wherein the first, second and third encoding means comprise Reed-Solomon encoders and the first, second and third decoding means comprise Reed-Solomon decoders.

35. The apparatus as in claim 28 wherein the means for combining the first erasure flag and second erasure flag comprises:
means for delaying the first erasure flag as deinterleaved to adjust for the processing time of the second decoding means; and
means for logically combining the delayed deinterleaved first erasure flag in synchronization with the second erasure flag as output from the second decoding means to generate the third erasure flag identifying errors within the sequence of fifth code groups.

36. The apparatus as in claim 28 further including read-while-write means for the interleaved and encoded data stream to trigger a rewrite of the data stream containing excessive errors, comprising:
means for reading the sequence of third code groups while being written to the media channel to provide the sequence of fourth code words with introduced errors;
means, coupled to the third decoding means, for counting the number of generated first erasure flags indicating the number of detected errors in a predetermined portion of the data stream in the sequence of fourth code words;
means for comparing the number of first erasure flags to a first threshold number; and
control means for triggering a rewrite of the predetermined portion of the data stream affected by errors when the comparison indicates that the number of first erasure flags exceed the first threshold.

37. The apparatus as in claim 36 wherein the control means further comprises:
means for inhibiting further data stream transmission to the first encoder; and
means for accessing the predetermined portion of the data stream in error as stored in the first series of data planes of the means for orthogonally interleaving for re-encoding and re-interleaving the data stream.

38. The apparatus as in claim 36 further comprising:
means, coupled to the second decoding means, for counting the number of generated second erasure flags indicating the number of detected errors in the predetermined portion of the data stream in the sequence of fifth code words; and
means for comparing the number of second erasure flags to a second threshold number;
wherein the control means triggers a rewrite of the predetermined portion of the data stream affected by errors when the comparison indicates that the number of second erasure flags exceeds the second threshold number.

39. A method for interleaving and encoding a user data stream, comprising the steps of:
dividing the user data stream into a sequence of first code groups;
encoding each first code group in the sequence to append a first error correction code to form a first code word;
sequentially combining each encoded first code word according to the sequence of first code groups to output a sequence of first code words;
arranging the sequence of first code words into a first series of two-dimensional column by row data planes;

orthogonally interleaving the first series of data planes to form a second series of two-dimensional column by row data planes, each column of the second series of data planes comprising a second code group for sequential output;

encoding each second code group in the sequence to append a second error correction code to form a second code word; and sequentially combining each encoded second code word according to the sequence of second code groups to output a sequence of second code words.

40. The method as in claim 39 wherein the step of orthogonal interleaving comprises the shuffling rows of the first series of data planes between data planes to form the second series of data planes such that each shuffled row maintains relative row position between the first and second series of data planes.

41. The method as in claim 39 further comprising the steps of:

arranging the sequence of second code words into a second code word two-dimensional column by row data plane, each row of the data plane comprising a third code group;

interleaving the arranged second code words in the second code word data plane by sequentially outputting the rows of the first data plane as a sequence of third code groups;

encoding each third code group in the sequence to append a third error correction code to form a third code word; and sequentially combining each encoded third code word according to the sequence of third code groups to output a sequence of third code words as the interleaved and encoded user data.

42. Apparatus for interleaving and encoding a data stream, comprising:

first encoding means for receiving and encoding the data stream, the first encoding means dividing the data stream into a series of user code groups by appending, to each user code group, a first error correction code to output a series of first code words;

first interleaving means for receiving the series of first code words from the first encoding means and for orthogonally interleaving the series of first code words to output an orthogonally interleaved series of second code groups;

second encoding means for receiving and encoding the orthogonally interleaved series of second code groups by appending, to each second code group, a second error correction code to output a series of second code words;

second interleaving means for receiving the series of second code words from the second encoding means and for interleaving the second series of code words to output a series of third code groups; and third encoding means for receiving and encoding the series of third code groups by appending, to each third code group, a third error correction code to output a series of third code words as the interleaved and encoded data stream.

43. The apparatus as in claim 42 further comprising media channel encoding means for receiving and encoding the series of third code words with a run-length limiting code.

44. The apparatus as in claim 42 wherein the first interleaving means includes means for sequentially storing the series of first code words into a first series of two-dimensional column by row data planes, one first code word stored per data plane column, the first code words orthogonally interleaved by inter-data plane row shuffling according to a predetermined shuffling sequence to form a second series of data planes with each column of the second series of two-dimensional column by row data planes comprising a second code group for sequential output.

45. The apparatus as in claim 44 wherein the means for storing in the first interleaving means comprises a pair of data storage buffers alternately available for reading and writing such that while a first buffer operates in a write mode to sequentially store a predetermined part of the series of first code words as the first series of data planes, a second buffer operates in a read mode to output a preceding part of the series of first code words as previously stored and orthogonally interleaved to form the second series of data planes.

46. The apparatus as in claim 45 wherein each data storage buffer comprises a plurality of two dimensional random access memories each holding at least one data plane.

47. The apparatus as in claim 42 wherein the second interleaving means includes means for sequentially storing the sequence of second code words into a first two-dimensional column by row data plane, one second code word per column, the second code words interleaved by sequentially outputting the rows of the first data plane with each row output comprising a third code group.

48. The apparatus as in claim 47 wherein the means for storing comprises a pair of two-dimensional column by row data storage buffers alternately available for reading and writing such that while a predetermined part of the series of second code words is sequentially written into the columns of a first buffer, a second buffer operates to sequentially read each row and output a preceding part of the sequence of second code words as previously stored in the columns of the buffer.

49. The apparatus as in claim 42 wherein the first, second and third encoding means comprise Reed-Solomon encoders.

50. The apparatus as in claim 42 further including means for decoding and deinterleaving a series of fourth code words, the series of fourth code words consisting of the series of third code words with included errors, comprising:

first decoding means for receiving the series of fourth code words, detecting errors and correcting a first number of errors in each fourth code word according to the third error correction code, the first decoding means further stripping the third correction code from each fourth code word to output a series of fourth code groups;

first deinterleaving means for receiving and deinterleaving the series of fourth code groups to output a series of fifth code words;

second decoding means for receiving the series of fifth code words, detecting errors and correcting a second number of errors in each fifth code word according to the second error correction code, the second decoding means stripping the second error correction code from each fifth code word to output a series of fifth code groups;

second deinterleaving means for receiving and orthogonally deinterleaving the series of fifth code groups to output a series of sixth code words; and third decoding means for receiving the series of sixth code words, detecting errors and correcting a third number of errors in each sixth code word according to the first error correction code, the third decoding means stripping the first error correction code from each sixth code word to output a series of sixth code groups, wherein the series of sixth code groups are substantially equal to the series of first code groups comprising the data stream.

51. The apparatus as in claim 50 wherein further including means, associated with the first decoding means, for outputting a first erasure flag with each fourth code group indicating the existence of a detected by uncorrected error therein and the second decoding means includes means for utilizing the first erasure flags to enhance error correction capability therein.

52. The apparatus as in claim 51 further including:
means, associated with the second decoding means, for outputting a second erasure flag with each fifth code group indicating the existence of a detected but uncorrected error therein; and
means for logically combining, in synchronization, the first and second erasure flags to generate a third erasure flag identifying detected but uncorrected errors in each sixth code word;
wherein the third decoding means includes means for utilizing the third erasure flags to enhance error correction capability such that the sum of the first, second and third corrected errors substantially equals the number of included errors.

53. The apparatus as in claim 50 further including read-while-write means to trigger a rewrite of the encoded and interleaved data stream containing errors, comprising:
means for reading the series of third code words while being written to provide the series of fourth code words including data errors;
means, coupled to the first decoding means, for counting the number of generated first erasure flags indicating the number of included errors in a predetermined part of the series of fourth code words;
means for comparing the number of first erasure flags to a first threshold number; and
control means for triggering a rewrite of the data stream corresponding to the predetermined portion of the series of fourth code words affected by errors when the first threshold number is exceeded.

54. The apparatus as in claim 53 wherein the control means further comprises:
means for inhibiting further data stream transmission to the first encoding means during the rewrite of the affected data; and
means for accessing a part of the data stream corresponding to the predetermined part of the series of fourth code words including excess errors for re-encoding and re-interleaving.

55. The apparatus as in claim 53 further including:
means, coupled to the second decoding means, for counting the number of generated second erasure flags indicating the number of included errors in a predetermined part of the series of fifth code words;
means for comparing the number of second erasure flags to a second threshold number; and
wherein the control means triggers a rewrite of the data stream corresponding to the predetermined portion of the series of fifth code words affected by errors when the second threshold number is exceeded.

56. The apparatus as in claim 50 further comprising:
means for encoding the series third code words with a run-length limiting code; and
means for decoding the run-length limiting encoded series of third code words to generate the series of fourth code words.

57. The apparatus as in claim 56 wherein the means for decoding run-length limiting encoded code words further includes means for detecting and flagging run-length limiting errors in the series of fourth code words, and wherein the first decoding means includes means for receiving run-length limiting error flags to enhance error correction capability.

58. The apparatus as in claim 57 further including:
means for logically combining, in synchronization, the run-length limiting error flags and first erasure flags to generate a fourth erasure flag;
wherein the second decoding means includes means for utilizing the fourth erasure flags to enhance error correction capability of the means for decoding and deinterleaving.

59. The apparatus as in claim 57 wherein the run-length limiting code is a Miller-squared code, and the means for run-length limiting encoding and decoding is a Miller-squared encoder and decoder, and wherein the means for detecting includes:
means for detecting short run data sequence violations in the undecoded series of code words received from the media channel and outputting short run error signal;
means for detecting long run data sequence violations in the undecoded series of code words received from the media channel and generating long run error signal;
means for detecting illegal Miller-squared sync sequences in the decoded series of code words received from the media channel and generating sync sequence error signal; and
means responsive to the short run, long run and sync sequence error signals for outputting run-length limiting error flags identifying data locations in the series of channel decoded fourth code words in error.

60. Apparatus for interleaving and encoding a data stream divided into a series of user code groups, comprising:
first encoding means for receiving and encoding the user data, the first encoding means appending to each user code group a first error correction code to output a series of first code words;
interleaving means for receiving the series of first code words from the first encoding means and for orthogonally interleaving the series of first code words to output an orthogonally interleaved series of second code groups;
second encoding means for receiving the orthogonally interleaved series of second code groups and appending, to each second code group, a second error correction code to output a series of second code words.

61. The apparatus as in claim 60 wherein the interleaving means includes means for storing the series of first code words into a first series of two-dimensional column by row data planes, the first code words orthogonally interleaved by inter-data plane row shuffling according to a predetermined shuffling sequence to form a second series of data planes with each column of the second series of two-dimensional column by row data planes comprising a second code group for sequential output.

62. The apparatus as in claim 60 further comprising:
second interleaving means for receiving the series of second code words from the second encoding means and for interleaving the second series of code words to output a series of third code groups; and
third encoding means for receiving the series of third code groups and appending, to each third code group, a third error correction code to output a series of third code words for transmission onto a media channel as the interleaved and encoded user data.

63. The apparatus as in claim 62 wherein the second interleaving means includes means for storing the sequence of second code words into a second code word two-dimensional column by row data plane, the second code words interleaved by sequentially outputting the rows of the data plane with each row output comprising a third code group.

* * * * *

UNITED STATES PATENT AND TRADEMARK OFFICE
CERTIFICATE OF CORRECTION

PATENT NO.   : 5,392,299
DATED        : February 21, 1995
INVENTOR(S)  : Don S. Rhines, Et al.

It is certified that error appears in the above-indentified patent and that said Letters Patent is hereby corrected as shown below:

Title page, item [54] and col. 2, line 1,

In the Title: "INTERLEAD", should be "INTERLEAVED"
Other Publications, 6th citation, "vol.-C-33", should be "vol.-CE-33".
Column 1, line 1, "INTERLEAD", should be "INTERLEAVED"
Column 5, line 8, after "code", delete "10".
Column 12, line 19, after "with", delete "10".
Column 18, line 36, "C1.C2", should be "C1.C2"

Signed and Sealed this

Twenty-first Day of November, 1995

Attest:

BRUCE LEHMAN

Attesting Officer

Commissioner of Patents and Trademarks